(12) United States Patent
Itakura

(10) Patent No.: US 8,106,640 B2
(45) Date of Patent: Jan. 31, 2012

(54) POWER SUPPLY CONTROL CIRCUIT, POWER SUPPLY DEVICE, POWER SUPPLY SYSTEM, AND METHOD OF CONTROLLING POWER SUPPLY CONTROL DEVICE

(75) Inventor: Kazuhiko Itakura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/064,327

(22) Filed: Mar. 18, 2011

(65) Prior Publication Data
US 2011/0169470 A1    Jul. 14, 2011

Related U.S. Application Data

(63) Continuation of application No. PCT/JP2008/067129, filed on Sep. 22, 2008.

(51) Int. Cl.
*G05F 1/56*    (2006.01)
(52) U.S. Cl. ............... 323/282; 323/272; 363/56.04; 361/93.4
(58) Field of Classification Search .......... 323/266–268, 323/272–275, 282–288; 363/50, 56.04, 124, 363/21.01, 131; 361/18, 58, 84, 93.4, 100, 361/212, 234
See application file for complete search history.

(56) References Cited

U.S. PATENT DOCUMENTS

| | | | | |
|---|---|---|---|---|
| 5,414,341 A | * | 5/1995 | Brown | 323/268 |
| 5,717,318 A | * | 2/1998 | Matsuda et al. | 323/273 |
| 5,847,554 A | * | 12/1998 | Wilcox et al. | 323/282 |
| 6,307,360 B1 | * | 10/2001 | Kajiwara et al. | 323/282 |
| 6,664,772 B2 | * | 12/2003 | Saeki et al. | 323/273 |
| 7,492,135 B2 | * | 2/2009 | Saeki et al. | 323/271 |
| 7,940,030 B2 | * | 5/2011 | Cannella et al. | 323/222 |
| 2002/0001206 A1 | | 1/2002 | Saeki et al. | |
| 2003/0133240 A1 | | 7/2003 | Manabe et al. | |
| 2005/0083715 A1 | | 4/2005 | Guillarme et al. | |

FOREIGN PATENT DOCUMENTS

JP    05-146049    6/1993

(Continued)

OTHER PUBLICATIONS

International Search Report for PCT/JP2008/067129, mailed Dec. 16, 2008.

*Primary Examiner* — Rajnikant Patel
(74) *Attorney, Agent, or Firm* — Staas & Halsey LLP

(57) ABSTRACT

A power supply control circuit detects a reference voltage VD corresponding to an intermediate voltage of a Hi Side FET and a Lo Side FET, when a short-circuit fault of the Lo Side FET is generated, and compares a threshold value VIN–VrefH and the reference voltage VD using a comparator COMP. The power supply control circuit determines that the short-circuit fault is generated, when the reference voltage VD is less than the threshold value VIN–VrefH and a switching control signal (HiDr) is in an ON state. Likewise, the power supply control circuit detects the reference voltage VD of the Hi Side FET and the Lo Side FET, when a short-circuit fault of the Hi Side FET is generated, and compares a threshold value VrefL and the reference voltage VD using the comparator COMP. The power supply control circuit determines that the short-circuit fault is generated, when the reference voltage VD is more than the threshold value VrefL and a switching control signal (LoDr) is in an ON state.

11 Claims, 17 Drawing Sheets

FOREIGN PATENT DOCUMENTS

| | | |
|---|---|---|
| JP | 08-228473 | 9/1996 |
| JP | 11-122838 | 4/1999 |
| JP | 2002-027737 | 1/2002 |
| JP | 2003-209968 | 7/2003 |
| JP | 2005-130593 | 5/2005 |
| JP | 2005-528067 | 9/2005 |
| WO | 03/063327 A2 | 7/2003 |
| WO | 2005/091482 A1 | 9/2005 |

* cited by examiner

SHORT FAULT

LOW IMPEDANCE FAULT

HIGH IMPEDANCE FAULT

OPEN FAULT

SHORT FAULT

LOW IMPEDANCE FAULT

HIGH IMPEDANCE FAULT

OPEN FAULT

SHORT FAULT

LOW IMPEDANCE FAULT

HIGH IMPEDANCE FAULT

OPEN FAULT

POWER SUPPLY CONTROL CIRCUIT, POWER SUPPLY DEVICE, POWER SUPPLY SYSTEM, AND METHOD OF CONTROLLING POWER SUPPLY CONTROL DEVICE

CROSS-REFERENCE TO RELATED APPLICATION

This application is a continuation of International Application No. PCT/JP2008/067129, filed on Sep. 22, 2008, the entire contents of which are incorporated herein by reference.

FIELD

The embodiments discussed herein are directed to a power supply control circuit, a power supply device, a power supply system, and a method of controlling a power supply control device.

BACKGROUND

In the related art, a rectification Field Effect Transistor (FET), such as a Hi Side FET or a Lo Side FET, has been used in a power supply used in products such as various electronic apparatuses starting from an information processing device.

Specifically, as illustrated in FIG. 27, used is a non-insulated DC-DC (direct current to direct current) converter step-down circuit (switching control system) that includes an input power supply, an input capacitor, a smoothing inductor, a smoothing capacitor, a load, a Hi Side FET, a Lo Side FET, and an inverter. This non-insulated DC-DC converter step-down circuit turns an input current ON/OFF by a switching control signal (HiDr or LoDr) output from a Hi driver or a Lo driver, averages a voltage/current by the smoothing inductor, the smoothing capacitor, and the load, and outputs the averaged voltage/current.

In this case, the input power supply is a power supply that supplies power to the non-insulated DC-DC converter step-down circuit, and the input capacitor is a capacitor that accumulates or discharges electric energy supplied therein or therefrom by the input power supply. The smoothing inductor is an inductor that is used to perform noise suppressing, rectifying, and smoothing in the non-insulated DC-DC converter step-down circuit. The smoothing capacitor is a capacitor that charges electricity when a voltage is high, discharges the electricity when the voltage is low, and smoothes a voltage. That is, it has a function of decreasing the voltage change (ripple voltage).

Meanwhile, in the power supply (for example, non-insulated DC-DC converter step-down circuit) where the rectification FET is used, when a short circuit of the rectification FET is generated, a large current may flow through the entire circuit. As a result, the power supply and an apparatus (connected apparatus) to which the power supply is connected are failed.

Therefore, when the short circuit is generated, a protection circuit illustrated in FIG. 28 is used to protect the entire circuit. When the protection circuit detects with the use of a current sensor resistor Rsense1 an excessive current flown from the input side of the power supply, the protection circuit determines such that a short-circuit fault of the Hi Side FET is generated and opens a Breaker FET1, to separate a fault place. Likewise, when the protection circuit detects with the use of a current sensor resistor Rsense2 an excessive current flown from the output side of the power supply, the protection circuit determines such that a short-circuit fault of the Lo Side FET is generated and opens a Breaker FET2 to separate a fault place.

The protection circuit detects a generated minute voltage by the current sense resistor Rsense1, amplifies the voltage by an amplifier AMP1, and compares a voltage, which is obtained by executing filtering of ignoring a temporary peak by a delay circuit DELAY1 with a reference voltage using a comparator COM1. As a result, when the voltage obtained by executing the filtering is higher than the reference voltage, the protection circuit detects that the short-circuit fault of the Hi Side FET is generated. Likewise, the protection circuit detects a generated minute voltage by the current sense resistor Rsense2, amplifies the voltage by an amplifier AMP2, and compares a voltage, which is obtained by executing filtering of ignoring a temporary peak by a delay circuit DELAY2 with a reference voltage using a comparator COM2. As a result, when the voltage obtained by executing the filtering is higher than the reference voltage, the protection circuit detects that the short-circuit fault of the Lo Side FET is generated.

However, the related art is problematic in that the short-circuit fault cannot be accurately detected. Specifically, in the protection circuit, in the case in which the power is supplied under some conditions such as when the capacitance of the output capacitor is large and when the load rapidly changes from a light load to a heavy load, the excessive current may be generated even in a normal state. When the power is supplied under a condition where the voltage remains in the output or the load rapidly changes from the heavy load to the light load, a reverse current may be generated even in a normal state. In the protection circuit according to the related art, when the reverse current attributable to the excessive current is generated, it cannot be determined whether the reverse current is generated due to the fault. For this reason, the reverse current attributable to the excessive current that is generated in the normal state is also determined as the fault.

In the protection circuit according to the related art, the voltage and the reference voltage are compared using the comparator. However, it takes time to make the reference voltage more than the originally desired detection voltage by several tens of percents to increase a threshold margin or execute the filtering by the delay circuit DELAY to prevent erroneous detection. For this reason, a long time may be needed to detect the fault, open the Breaker FET, and separate the fault place. As a result, the input voltage of the power supply is lowered and the voltage of the entire device is also lowered. That is, there is a fear that the short-circuit fault spreads and the entire device is stopped.

In the protection circuit according to the related art, when an impedance fault is generated, a voltage effect of the current sensor resistor Rsense1 (or the current sense resistor Rsense2) is extraordinarily small or is not generated. For this reason, the impedance fault cannot be detected. As a result, heat generation and burnout are caused. In this case, the impedance fault means a state in which the FET is failed with a certain resistance value but it did not get to a perfect short-circuit state in the FEC, that is, a midway fault between a short fault and an open fault.

Patent Document: Japanese Laid-open Patent Publication No. 05-146049

SUMMARY

According to an aspect of an embodiment of the invention, a power supply control circuit includes a first current breaking circuit of which an input terminal is connected to a first electrode of an input power supply and that breaks a current from the input power supply based on a break control signal input to a control terminal; a first switching circuit of which an input terminal is connected to an output terminal of the first current breaking circuit, of which an output terminal is connected to a reference node, and that switches a current flown to the reference node or a current flown from the reference node based on a first switching control signal inputted to a control terminal; a second switching circuit of which an input terminal is connected to the reference node, of which an output terminal is connected to a second electrode of the input power supply, and that switches a current flown from the reference node or a current flown to the reference node based on a second switching control signal inputted to a control terminal; a second current breaking circuit of which an output terminal is connected to a load and that breaks a current from the input power supply based on the break control signal inputted to a control terminal; and a break control signal generating circuit that outputs the break control signal when the first switching control signal is in an ON state in the case where a voltage of the reference node is lower than a first reference voltage as the comparison result of the voltage of the reference node and the first reference voltage or when the second switching control signal is in an ON state in the case where the voltage of the reference node is higher than a second reference voltage as the comparison result of the voltage of the reference node and the second reference voltage.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF DRAWINGS

FIG. 13 is a diagram illustrating an operation waveform at the time of an open fault of the Hi Side FET that is generated when a load current is small;

DESCRIPTION OF EMBODIMENTS

Preferred embodiments of the present invention will be explained with reference to accompanying drawings.

[a] First Embodiment

Outline of a Power Supply Control Circuit

Figure 1:
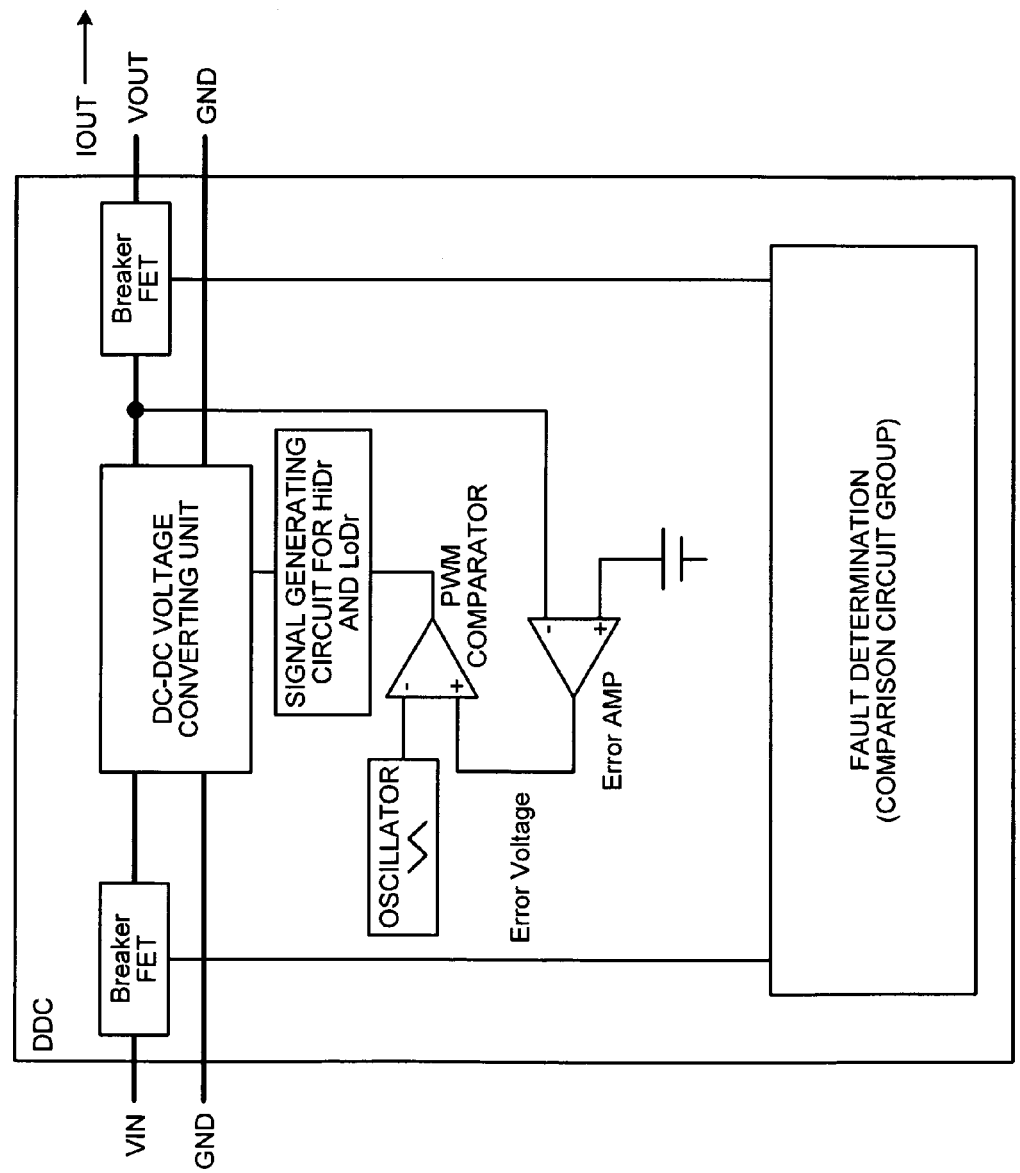
FIG. 1 is a diagram illustrating a DDC converter that includes a power supply control circuit according to a first embodiment.

First, the outline of a power supply control circuit according to a first embodiment will be described using FIG. 1. FIG. 1 is a diagram illustrating a DDC (an abbreviation of "DC-DC converter") converter that includes the power supply control circuit according to the first embodiment.

As illustrated in FIG. 1, the DDC converter is a device that converts an input voltage VIN into VOUT (load current IOUT) by a DC-DC voltage converting unit and outputs the converted current. It is also a DC-DC converter (DC/DC converter: direct current-direct current converter) (for example, DC-DC converter of a switching system) that realizes energy saving or size/weight reduction of an information processing device using an LSI where a voltage is decreased by minuteness, a mobile apparatus such as a mobile phone where the operability is improved, and an electronic apparatus.

To the DC-DC voltage converting unit, an Error AMP corresponding to an error amplifier that always compares the reference voltage GND corresponding to the ground potential with the output voltage VOUT, amplifies an error thereof, and controls an error voltage signal (Error Voltage) and a PWM COMPARATOR that modulates the pulse width on the basis of an output from the Error AMP and an output from an oscillator are connected. The DC-DC voltage converting unit has a signal generating circuit" that generates HiDr (may be referred to as a "first switching control signal") and LoDr (may be referred to as a "second switching control signal"), on the basis of the pulse width output from the PWM COMPARATOR.

Since the PWM COMPARATOR, the Error AMP, and the signal generating circuit constitute are circuits included in the general DC-DC comparator, the detailed description thereof is omitted herein. The DC indicates a Direct Current and the PWM COMPARATOR is a Pulse Width Modulation COMPARATOR.

Therefore, the power supply control circuit according to this embodiment has a Breaker FET: breaker transistor that is connected to the input side of the DC-DC voltage converting unit, a Breaker FET: breaker transistor that is connected to the output side, and a comparison circuit group that is connected to each FET, and can accurately detect a short-circuit fault.

Specifically, the power supply control circuit according to the first embodiment detects the reference voltage VD (may be referred to as a "voltage of a reference node") of the Hi Side FET and the Lo Side FET, when the short-circuit fault of the Lo Side FET is generated, and compares the threshold value VIN−VrefH and the reference voltage VD using the comparator COMP. The power supply control circuit determines that a fault is generated, when the reference voltage VD is less than the threshold value VIN−VrefH and the switching control signal (HiDr) is in an ON state.

Likewise, the power supply control circuit according to the first embodiment detects the reference voltage VD of the Hi Side FET and the Lo Side FET, when the short-circuit fault of the Hi Side FET is generated, and compares the threshold value VrefL and the reference voltage VD using the comparator COMP. The power supply control circuit determines that a fault is generated, when the reference voltage VD is more than the threshold value VrefL and the switching control signal (LoDr) is in an ON state.

As such, the power supply control circuit according to the first embodiment can use the comparator in detecting the short-circuit fault to detect the short-circuit fault with high precision and at a high speed. Further, the power supply control circuit can use AND logic in determining the short-circuit fault to accurately determine the short-circuit fault without erroneous detection.

Configuration of the Power Supply Control Circuit

Figure 2:
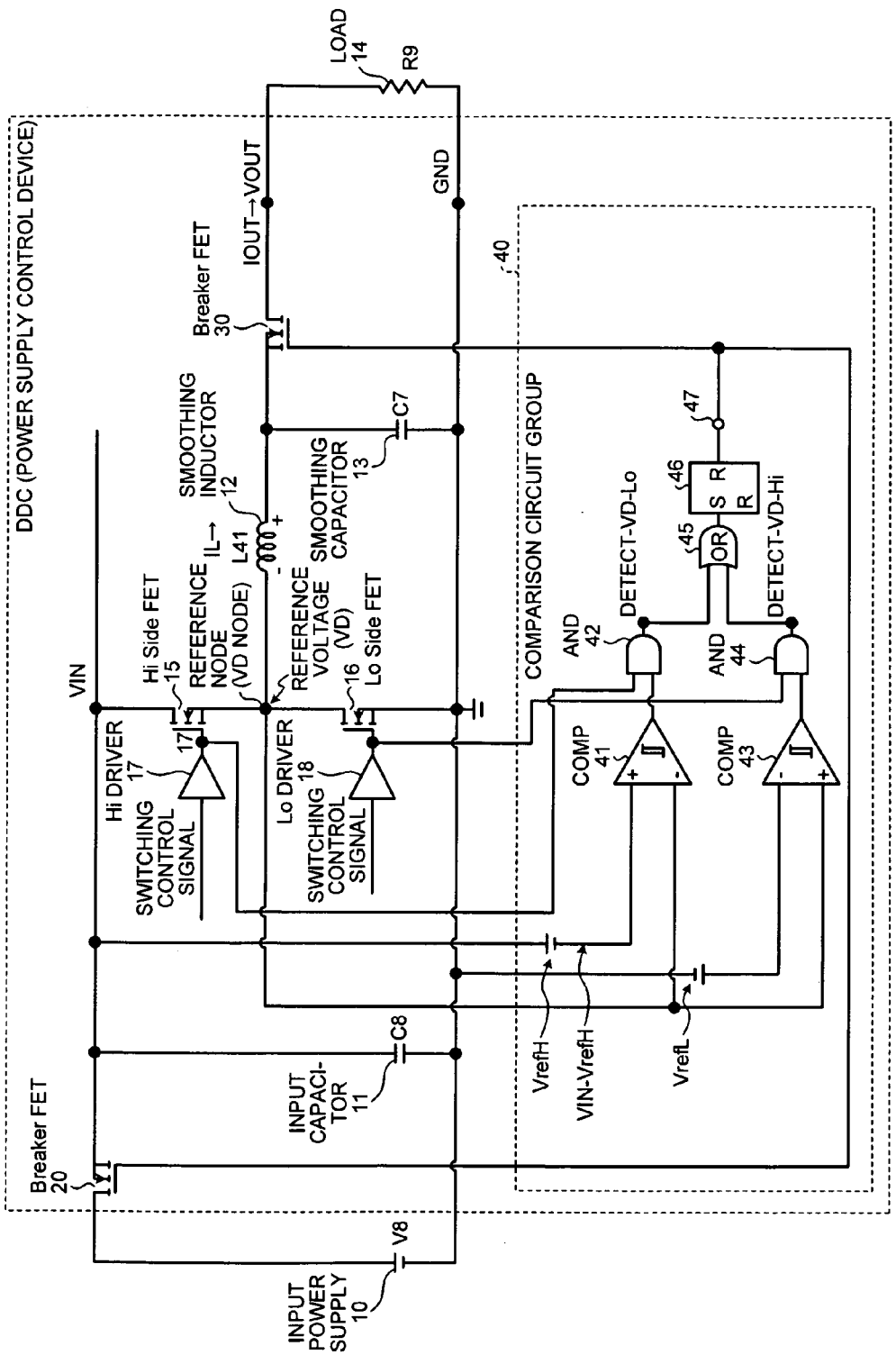
FIG. 2 is a block diagram illustrating the configuration of the power supply control circuit according to the first embodiment.
Figure 27:
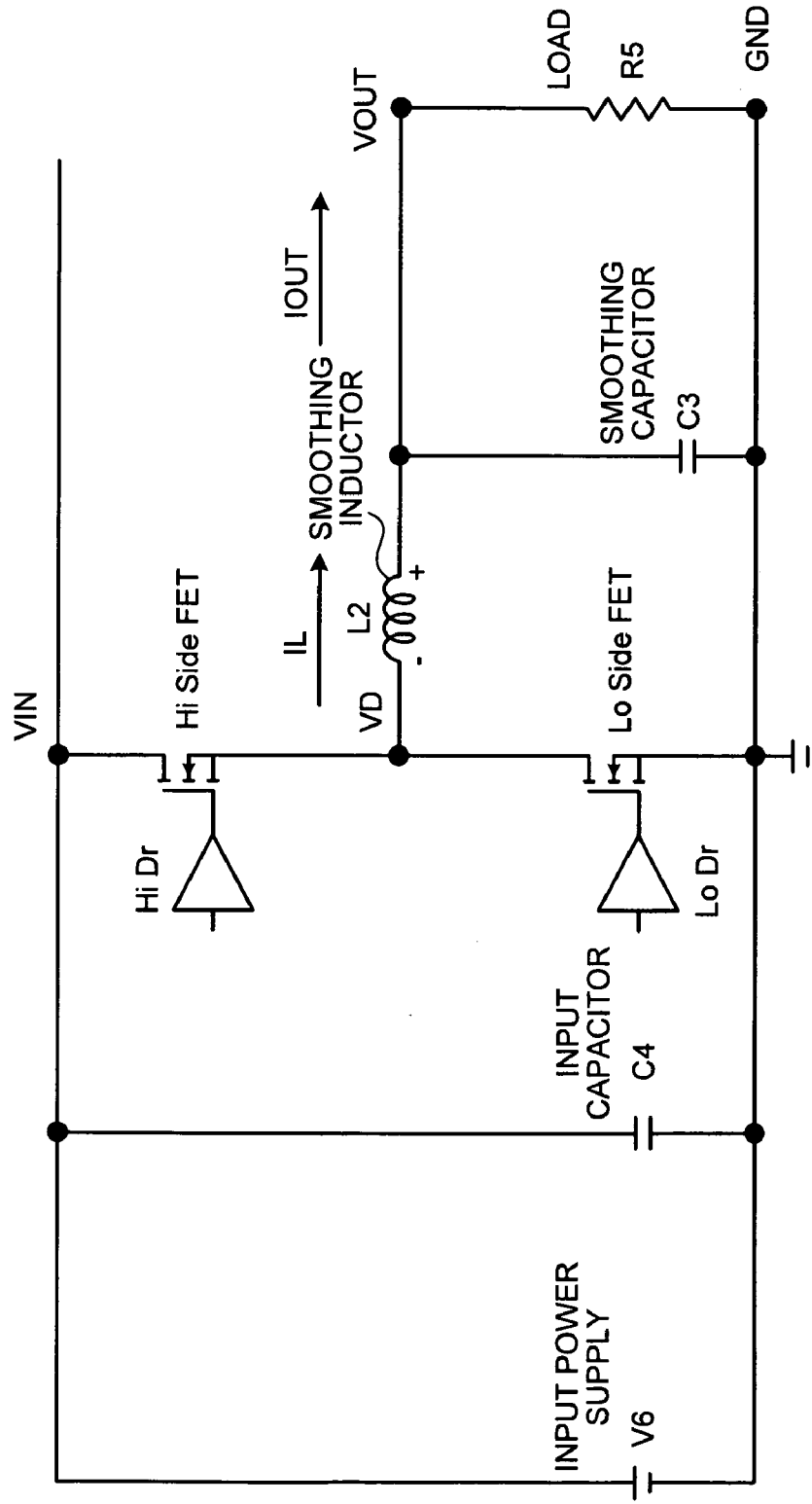
FIG. 27 is a diagram illustrating an example of a DC-DC converter according to the related art.
Figure 28:
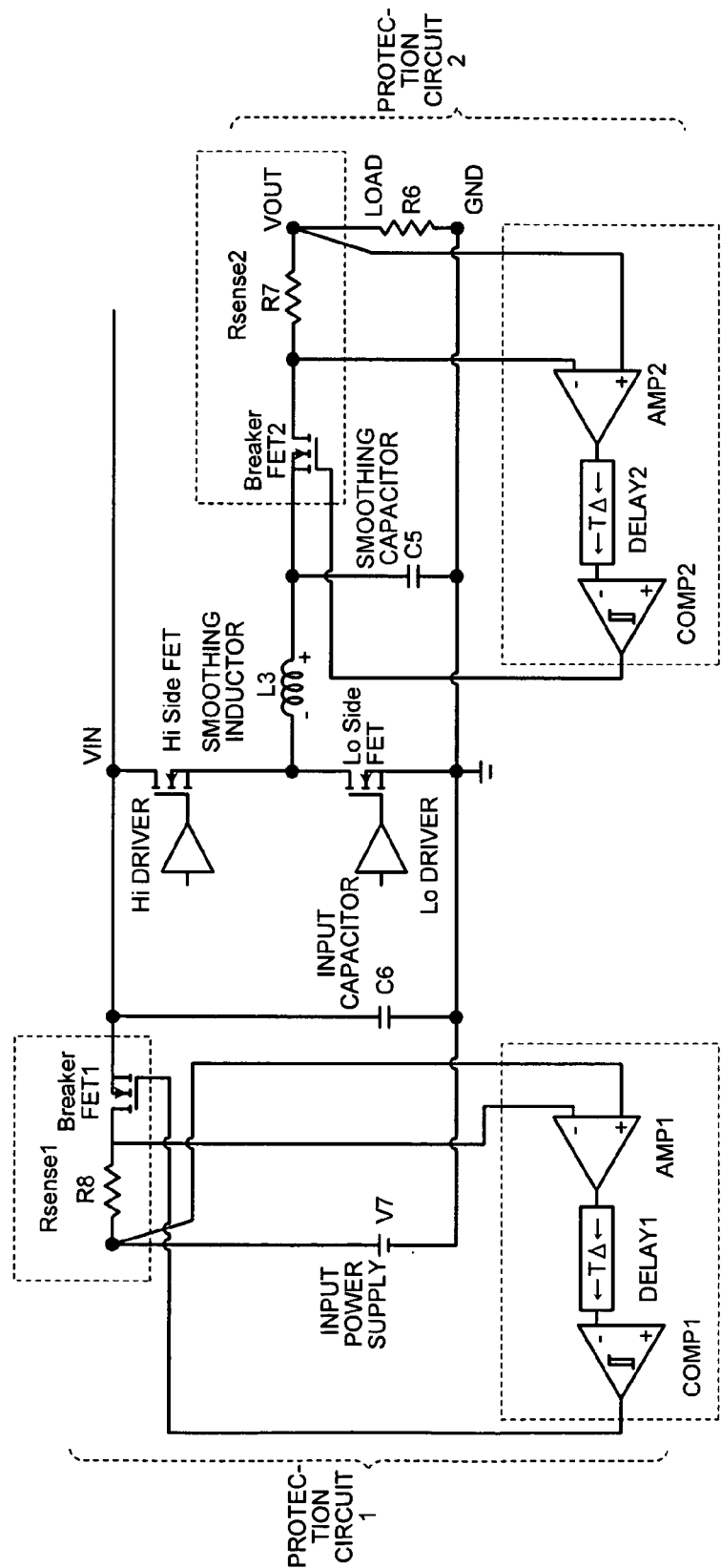
FIG. 28 is a diagram illustrating the short-circuit protection configuration of the DC-DC converter according to the related art.

Next, the configuration of the power supply control circuit illustrated in FIG. 1 will be described using FIG. 2. FIG. 2 is a block diagram illustrating the configuration of the power supply control circuit according to the first embodiment. The power supply control circuit illustrated in FIG. 2 is a circuit that is incorporated in a DDC. The power supply control circuit is a circuit where a Breaker FET 20, a Breaker FET 30, and a comparison circuit group 40 are connected to a non-insulated DC-DC converter step-down circuit (refer to FIG. 27).

As described above, the non-insulated DC-DC converter step-down circuit in the power supply control circuit illustrated in FIG. 2 has an input power supply 10, an input capacitor 11, a smoothing inductor 12, a smoothing capacitor 13, a load 14, a Hi Side FET 15, a Lo Side FET 16, a Hi driver 17, and a Lo driver 18. The DC-DC converter step-down circuit makes an input current become ON/OFF by the Hi Side FET 15 or the Lo Side FET 16, on the basis of a switching control signal (HiDr or LoDr) output from the Hi driver 17 or the Lo driver 18, averages a voltage/current by the smoothing inductor 12, the smoothing capacitor 13, and the load 14, and outputs the averaged voltage/current.

Among them, the input power supply 10 supplies power to the non-insulated DC-DC converter step-down circuit, and the input capacitor 11 is a capacitor that accumulates or discharges electric energy supplied by the input power supply. The smoothing inductor 12 is an inductor that is used to perform noise suppressing, rectifying, and smoothing in the non-insulated DC-DC converter step-down circuit. The smoothing capacitor 13 is a capacitor that charges electricity when a voltage is high, discharges the electricity when the voltage is low, and smoothes a voltage, that is, has a function for decreasing the voltage change (ripple voltage).

An input terminal of the Hi Side FET 15 is connected to an output terminal of the Breaker FET 20 and an output terminal thereof is connected to a reference node (VD node), and the Hi Side FET 15 switches a current flown to the reference node or a current flown from the reference node, on the basis of the switching control signal (HiDr) input to the control terminal.

An input terminal of the Lo Side FET 16 is connected to the reference node (VD node) and an output terminal thereof is connected to a second electrode of the input power supply 10, and the Lo Side FET 16 switches a current flown from the reference node or a current flown to the reference node, on the basis of the switching control signal (LoDr) input to the control terminal.

The switching control signal (HiDr) and the switching control signal (LoDr) may be controlled to become ON exclusively.

The Breaker FET 20 is a circuit of which an input terminal is connected to the first electrode of the input power supply 10 and breaks the current from the input power supply, on the basis of an break control signal input from an inverter 47 to be described below to a control terminal. The Breaker FET 30 is a circuit of which an output terminal is connected to the load 14 and breaks the current flown from the reference node (VD node), on the basis of a break control signal input from the inverter 47 to a control terminal.

The comparison circuit group 40 is a circuit that outputs the break control signal when the switching control signal (HiDr) is in an ON state, in the case where the voltage VD is less than the threshold value VIN−VrefH as the comparison result of the voltage (VD) of the reference node (VD node) and the threshold value (VIN−VrefH). The comparison circuit group 40 outputs the break control signal even when the switching control signal (LoDr) is in an ON state, in the case where the voltage VD is more than the threshold value VrefL as the comparison result of the voltage (VD) of the reference node (VD node) and the threshold value (VrefL).

The comparison circuit group 40 can have the circuit configuration where a comparison circuit (COMP 41), a logical product circuit (AND circuit 42), a comparison circuit (COMP 43), a logical product circuit (AND circuit 44), a logical sum circuit (OR circuit 45), an FF (Flip-Flop) circuit 46, and the inverter 47 are included.

The comparison circuit 41 is a comparison circuit that compares the voltage of the reference node (VD node) and the threshold value VIN−VrefH, and the AND circuit 42 is a logical product circuit that generates the logical product of an output from the comparison circuit COMP 41 and the switching control signal (HiDr). The comparison circuit COMP 43 is a comparison circuit that compares the voltage of the reference node (VD node) and the threshold value VIN−VrefL, and the AND circuit 44 is a logical product circuit that generates the logical product of an output from the comparison circuit COMP 43 and the switching control signal (LoDr). The OR circuit 45 is a logical sum circuit that generates the logical sum of an output from the AND circuit 42 and an output from the AND circuit 44, and the FF circuit 46 is a flip-flop circuit that holds an output from the OR circuit 45 and outputs an break control signal to break the short-circuit generation place.

When the FF circuit 46 applies an output Hi of the OR circuit 45 to a Set input, the FF circuit 46 maintains a Hi state. This Hi state is continued until the FF circuit 46 is reset. (Further, when power is supplied again from the power supply device, the FF circuit 46 applies to Hi to an R input to return the state of the FF circuit 46 to an initial state, and is reset). When the inverter 47 receives an output "Q=Hi" from the FF circuit 46, the inverter 47 inverts the output and outputs the break control signals to turn off the Breaker FET 20 and the Breaker FET 30 to the Breaker FET 20 and the Breaker FET 30. If the Breaker FET 20 and the Breaker FET 30 receive the break control signals from the inverter 47, the Breaker FET 20 and the Breaker FET 30 open the corresponding circuit to separate the fault place from the power supply control device.

The threshold value VIN−VrefH may be referred to as a "first reference voltage", the threshold value VrefL corresponds to the "second reference voltage" that is recited in claims, and VIN−VrefH can be set to be more than VrefL.

Figure 3:
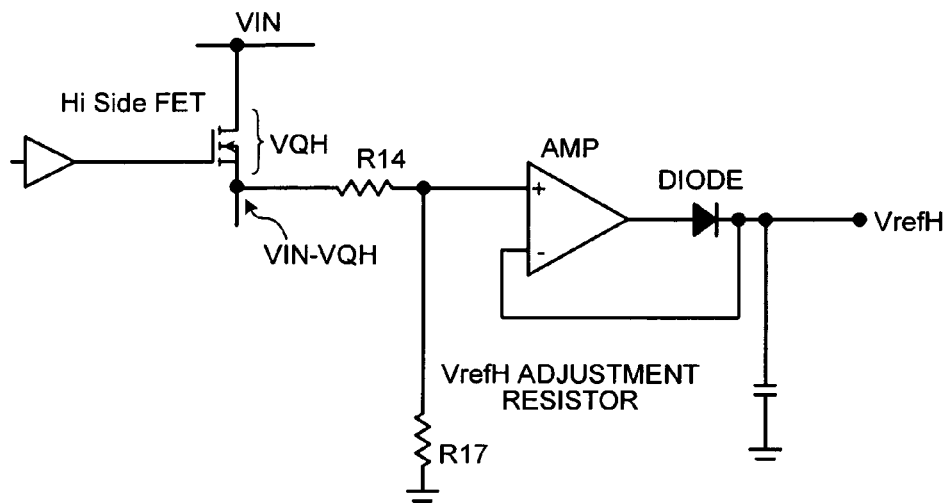
FIG. 3 is a diagram illustrating an example of a method of setting a threshold value of (VIN−VrefH)
Figure 4:
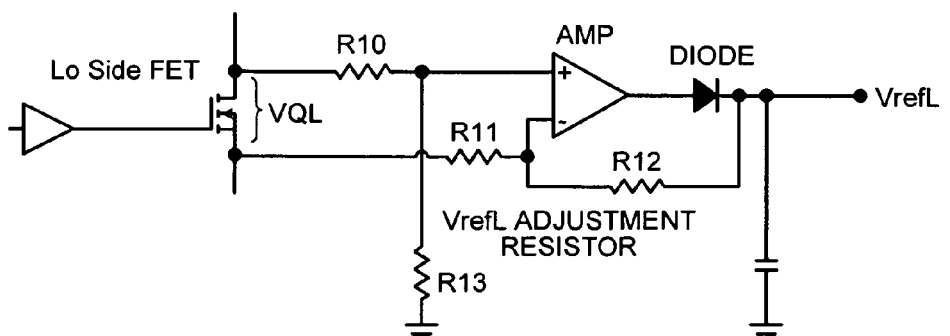
FIG. 4 is a diagram illustrating an example of a method of setting a threshold value VrefL.

In this case, a setting method of the threshold values VIN−VrefH and VrefL will be described using FIGS. 3 and 4. FIG. 3 illustrates an example of a setting method of the threshold value VIN−VrefH. FIG. 4 illustrates an example of a setting method of the threshold value VrefL.

As illustrated in FIG. 3, when a voltage applied to the Hi Side FET is defined as VQH, VrefH becomes (VIN−VQH)× (R17/(R14+R17)) (voltage slightly lower than VIN−VQH). In this case, if a resistance value of the resistor R17 to adjust VrefH is decreased, the threshold margin is increased. Thereby, the threshold value VIN−VrefH is set as "(VIN−VQH)×α." However, it is assumed that VQH is IdsQH×RdsQH and α has a value of 1 or less (in general, about 0.9) to be a threshold margin coefficient set in consideration of the variation.

As illustrated in FIG. 4, when a voltage applied to the Lo Side FET is defined as VQL, VrefL becomes (VQL)×(R13/ (R10+R13))×((R11+R12)/(R11)) (voltage slightly higher than VQL). In this case, if a resistance value of the resistor R13 to adjust VrefL is increased, the threshold margin is increased. Thereby, the threshold value VrefL is set as VQL× β. However, it is assumed that VQL is IdsQL×RdsQL and β has a value of 1 or less (in general, about 0.9) to be a threshold margin coefficient set in consideration of the variation.

The comparison circuit group 40 uses the threshold values VIN−VrefH and VrefL and the voltage (VD) of the reference node set by the above method to set determination conditions of the short-circuit fault as "switching control signal (HiDr)=Hi and reference voltage (VD)<threshold value (VIN−VrefH)" and "switching control signal (LoDr)=Hi and reference voltage (VD)>threshold value (VrefL)".

The power supply control circuit detects the intermediate voltage VD of the Hi Side FET 15 and the Lo Side FET 16, when the short-circuit fault of the Hi Side FET 15 is generated, and compares the intermediate value VD and the voltage (GND+Bias)=VrefL by the comparison circuit (COMP 43). When the intermediate voltage VD is higher than the voltage (GND+Bias)=VrefL, the power supply control circuit takes the AND logic with the switching control signal (LoDr). As a result, in the case of the positive logic, the power supply control circuit controls the Breaker FET 20 and the Breaker FET 30 to be turned off.

The power supply control circuit detects the intermediate voltage VD of the Hi Side FET 15 and the Lo Side FET 16, when the short-circuit fault of the Lo Side FET 16 is generated, and compares the intermediate voltage VD and the voltage (Vi+Bias)=(VIN−VrefH) by the comparison circuit (COMP 41). When the intermediate voltage VD is lower than the voltage (Vi+Bias)=(VIN−VrefH), the power supply control circuit takes the AND logic with the switching control signal (LoDr). As a result, in the case of the positive logic, the power supply control circuit controls the Breaker FET 20 and the Breaker FET 30 to be turned off.

In this way, since the short-circuit fault can be detected with high precision and at a high speed, the short-circuit fault can be accurately detected without erroneous detection. As compared with the method according to the related art, redundancy of the power supply can be secured with the simple configuration where the number of components is small.

Operation Waveform of the Power Supply Control Circuit

Next, an operation waveform in a normal state and an operation waveform in a failed state in the power supply control circuit according to the first embodiment will be described using FIGS. 5 to 26.

In FIGS. 5 to 26, "ton" indicates an electrically conductive time of the Hi Side FET 15, "toff" indicates an electrically conductive time of the Lo Side FET 16, "tsw" indicates a period of voltage feedback control, "IOUT" indicates a load current, "IL" indicates a current that flows to the smoothing inductor 12, and "ILpp" indicates a ripple current that flows to the smoothing inductor 12. Further, "VQH" indicates a decrease in the voltage when the Hi Side FET 15 is in an electrically conductive state (VQH=IdsQH×RdsQH), and "VQL" indicates a decrease in the voltage when the Lo Side FET 16 is in an electrically conductive state (VQL=IdsQL× RdsQL).

1. Operation Waveform in the Normal State

Figure 5:
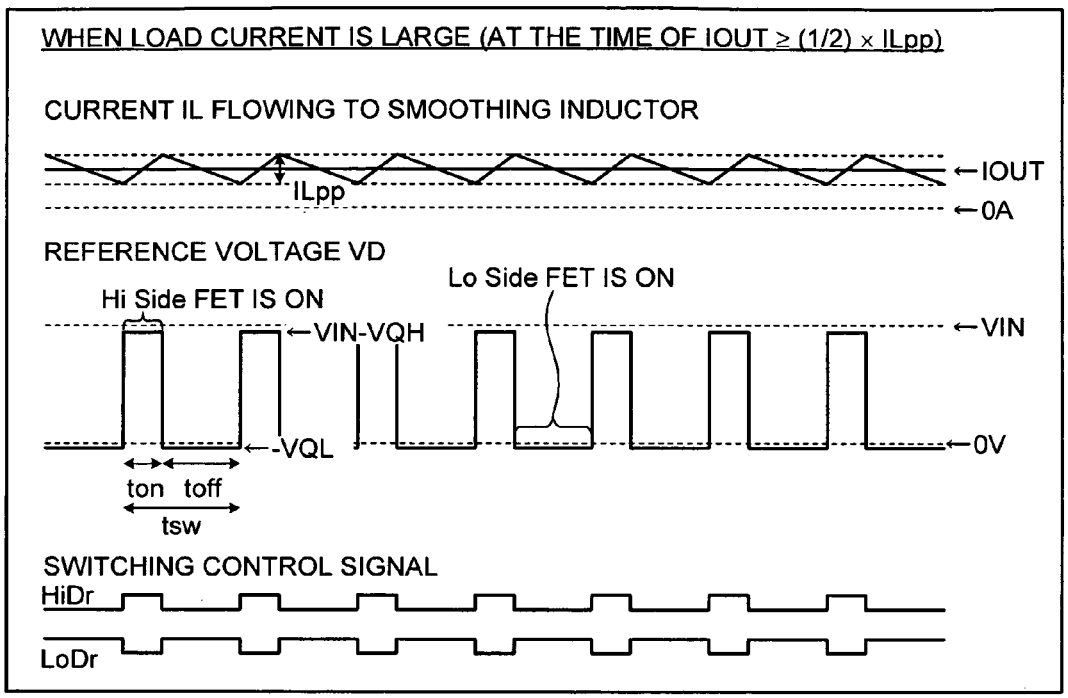
FIG. 5 is a diagram illustrating a normal operation waveform of when a load current is large.
Figure 6:
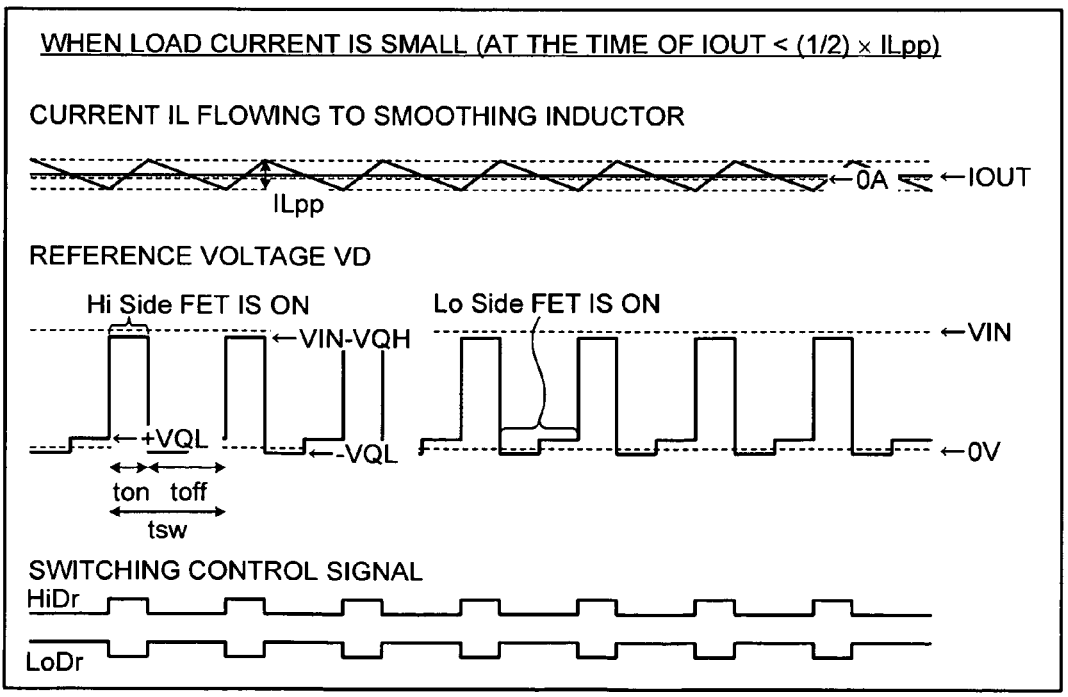
FIG. 6 is a diagram illustrating a normal operation waveform of when a load current is small.

First, the operation waveform in the normal state in the power supply control circuit according to the first embodiment will be described using FIGS. 5 and 6. FIG. 5 illustrates a normal operation waveform of when a load current is large. FIG. 6 illustrates a normal operation waveform of when a load current is small. When the load current is large, this means that (IOUT≧(½)×ILpp). When the load current is small, this means that (IOUT<(½)×ILpp).

As illustrated in FIGS. 5 and 6, in the normal state, the voltage feedback is controlled such that ton=(VOUT+VQH)× tsw and toff=tsw−ton are satisfied. At this time, the reference voltage VD becomes VD=VIN−VQH (at the time of ton) and VD=−VQL (at the time of toff). When the load current is small ((IOUT<(½)×ILpp) is satisfied), because a period where a current flows backward through the smoothing inductor 12 is generated, VD=+VQL is satisfied.

2. Operation Waveform in the Failed State

Next, the operation waveform in the failed state in the power supply control circuit according to the first embodiment will be described. In this case, each of the case of "generation of the short-circuit fault of the Hi Side FET" when "the load current is large" or "the load current is small" and the case of "generation of the short-circuit fault of the Lo Side FET" when "the load current is large" or "the load current is small" will be described.

2-1. Case Where the Short-Circuit Fault of the Hi Side FET Is Generated

Figure 7:
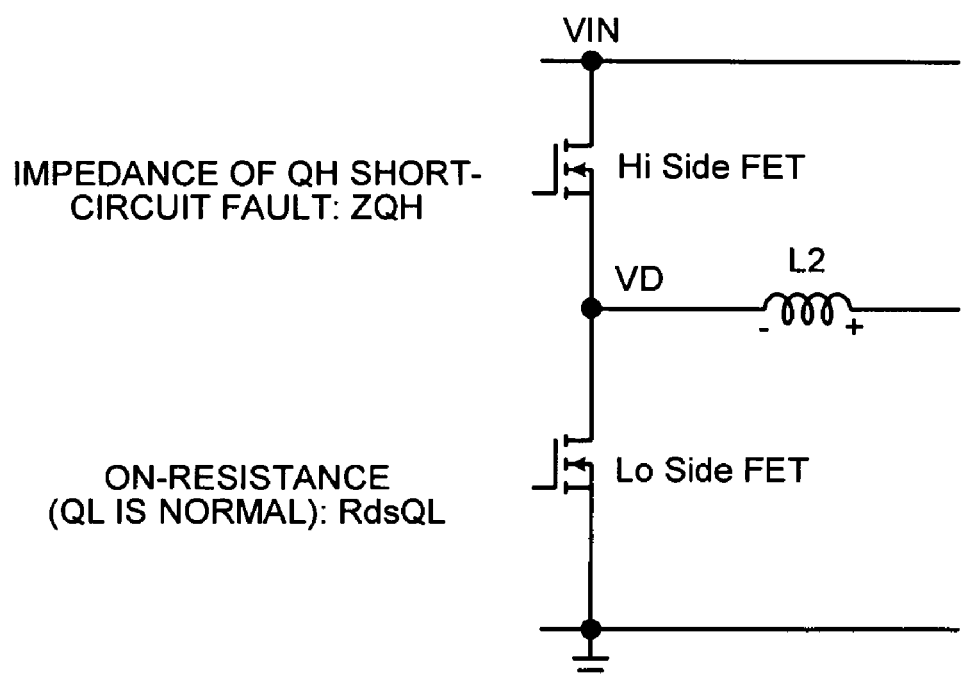
FIG. 7 is a diagram illustrating the case where a short-circuit fault of a Hi Side FET is generated.

First, the outline of the case of the generation of the short-circuit fault of the Hi Side FET 15 will be described using FIG. 7. FIG. 7 illustrates the case where the short-circuit fault of the Hi Side FET is generated. As illustrated in FIG. 7, in the case where the short-circuit fault of the Hi Side FET is generated, if the impedance of the short-circuit fault of the Hi Side FET is defined as ZQH, VIN division of the ON-resistance RdsQL and ZQH of the Lo Side FET and ZQH becomes the reference voltage VD. That is, VD=(RdsQL/(ZQH+RdsQL))×VIN is satisfied.

2-1-1. Case Where the Short-Circuit Fault of the Hi Side FET Is Generated (Load Current Is Large)

In this case, the short fault, the Low impedance fault, the High impedance fault, and the open fault that are generated in the Hi Side FET when the load current is large will be described. When the load current is large, this state is a state of load current (IOUT)>=(½)×ripple current (ILpp).

a. Short Fault

Figure 8:
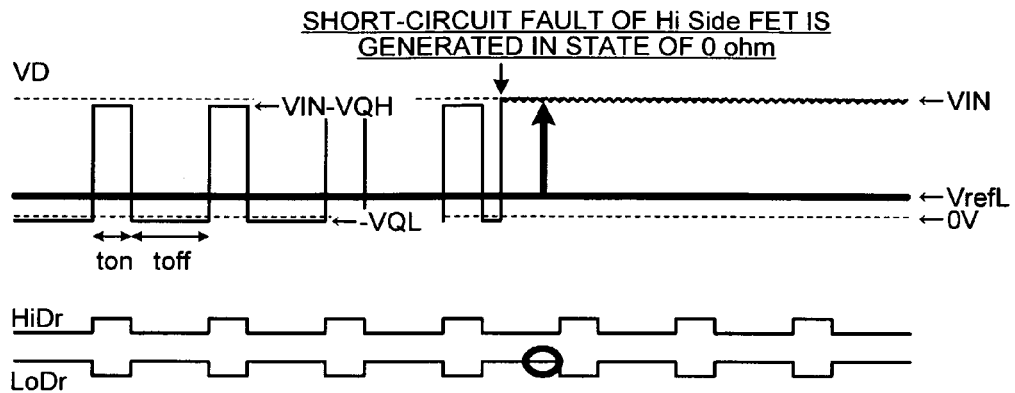
FIG. 8 is a diagram illustrating an operation waveform at the time of a short fault of the Hi Side FET that is generated when a load current is large.

First, the short fault of the Hi Side FET that is generated when the load current is large will be described using FIG. 8. FIG. 8 illustrates an operation waveform at the time of the short fault of the Hi Side FET that is generated when the load current is large. In this case, the short fault means that the impedance ZQH of when the short-circuit fault is generated is 0 ohm. Therefore, the power supply control circuit according to the first embodiment can approximate the reference voltage VD to VIN. Since "switching control signal (LoDr)=Hi and reference voltage (VD)>threshold value (VrefL)" are satisfied, the power supply control circuit determines that the short-circuit fault of the Hi Side FET is generated.

Specifically, if the comparison result of the reference voltage VD and the threshold value VrefL using the comparator (COMP 43) becomes VD>VrefL, the power supply control circuit according to the first embodiment sets an output of the COMP 43 as Hi. Next, when the power supply control circuit receives the output Hi of the COMP 43 and the switching control signal LoDr=Hi by the AND circuit 44, the AND circuit 44 outputs Hi and the OR circuit 45 that receives the output of the AND circuit 44 outputs Hi. The output Hi of the OR circuit 45 is applied to the Set input of the FF circuit 46 and the output Q of the FF circuit 46 maintains the Hi state. This Hi state is continued until the FF circuit 46 is reset. Then, the power supply control circuit receives Q=Hi, performs logical inversion by the inverter 47, and turns off the Breaker FET 20 and the Breaker FET 30. As such, the power supply control circuit according to the first embodiment turns off the Breaker FET 20 and the Breaker FET 30 and separates the fault place for protection.

b. Low Impedance Fault

Figure 9:
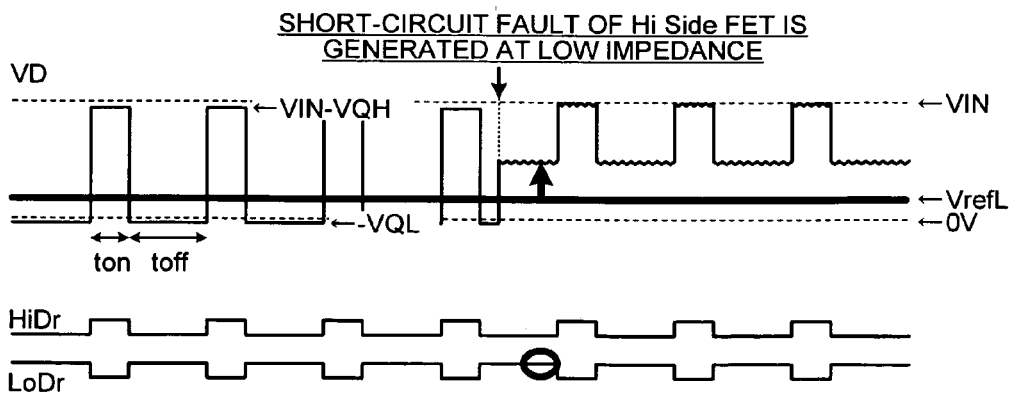
FIG. 9 is a diagram illustrating an operation waveform at the time of a Low impedance fault of the Hi Side FET that is generated when a load current is large.

Next, the Low impedance fault of the Hi Side FET that is generated when the load current is large will be described using FIG. 9. FIG. 9 illustrates an operation waveform at the time of a Low impedance fault of the Hi Side FET that is generated when the load current is large. In this case, the Low impedance fault means that the impedance ZQH of when the short-circuit fault is generated is a value (for example, several milli-ohm) approximated to the ON-resistance of the Hi Side FET. Therefore, the power supply control circuit according to the first embodiment can approximate the reference voltage VD to "(½)×VIN to VIN". Since "switching control signal (LoDr)=Hi and reference voltage (VD)>threshold value (VrefL)" are satisfied, the power supply control circuit determines that the short-circuit fault of the Hi Side FET is generated.

Specifically, if the comparison result of the reference voltage VD and the threshold value VrefL using the comparator (COMP 43) becomes VD>VrefL, the power supply control circuit according to the first embodiment sets an output of the COMP 43 as Hi. Next, when the power supply control circuit receives the output Hi of the COMP 43 and the switching control signal LoDr=Hi by the AND circuit 44, the AND circuit 44 outputs Hi and the OR circuit 45 that receives the output of the AND circuit 44 outputs Hi. The output Hi of the OR circuit 45 is applied to the Set input of the FF circuit 46 and the output Q of the FF circuit 46 maintains the Hi state. This Hi state is continued until the FF circuit 46 is reset. Then, the power supply control circuit receives Q=Hi, performs logical inversion by the inverter 47, and turns off the Breaker FET 20 and the Breaker FET 30. As such, the power supply control circuit according to the first embodiment turns off the Breaker FET 20 and the Breaker FET 30 and separates the fault place for protection.

c. High Impedance Fault

Figure 10:
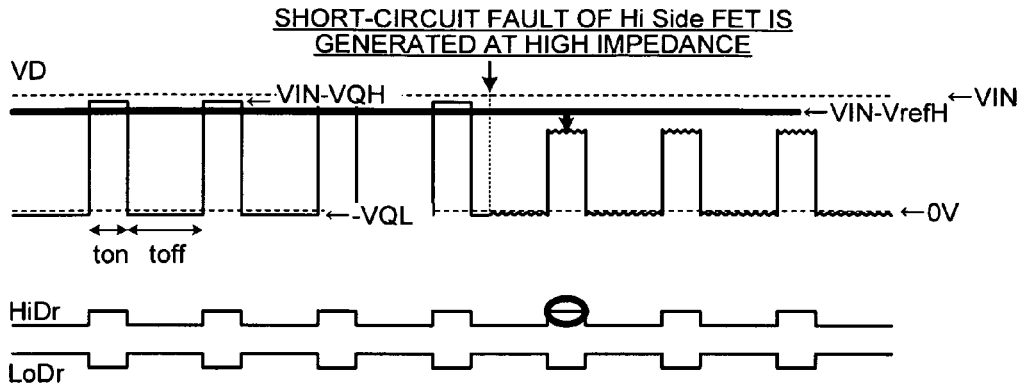
FIG. 10 is a diagram illustrating an operation waveform at the time of a High impedance fault of the Hi Side FET that is generated when a load current is large.

Next, the High impedance fault of the Hi Side FET that is generated when the load current is large will be described using FIG. 10. FIG. 10 illustrates an operation waveform at the time of a High impedance fault of the Hi Side FET that is generated when the load current is large. In this case, the High impedance fault means that the impedance ZQH of when the short-circuit fault is generated is a value (for example, several tens of milli-ohm) more than the ON-resistance of the Hi Side FET. Therefore, the power supply control circuit according to the first embodiment can approximate the reference voltage VD to "0 V to (VIN−(Ids×ZQH))" by decreasing the voltage by Ids×ZQH. Since "switching control signal (HiDr)=Hi and reference voltage (VD)<threshold value (VIN−VrefH)" are satisfied, the power supply control circuit determines that the short-circuit fault of the Hi Side FET is generated.

Specifically, if the comparison result of the reference voltage VD and the threshold value (VIN−VrefH) using the comparator (COMP 41) becomes VD<(VIN−VrefH), the power supply control circuit according to the first embodiment sets an output of the COMP 41 as Hi. Next, if the power supply control circuit receives the output Hi of the COMP 41 and the switching control signal HiDr=Hi by the AND circuit 42, the AND circuit 42 outputs Hi and the OR circuit 45 that receives the output of the AND circuit 42 outputs Hi. The output Hi of the OR circuit 45 is applied to the Set input of the FF circuit 46 and the output Q of the FF circuit 46 maintains the Hi state. This Hi state is continued until the FF circuit 46 is reset. Then, the power supply control circuit receives Q=Hi, performs logic inversion by the inverter 47, and turns off the Breaker FET 20 and the Breaker FET 30. As such, the power supply control circuit according to the first embodiment turns off the Breaker FET 20 and the Breaker FET 30 and separates the fault place for protection.

d. Open Fault

Figure 11:
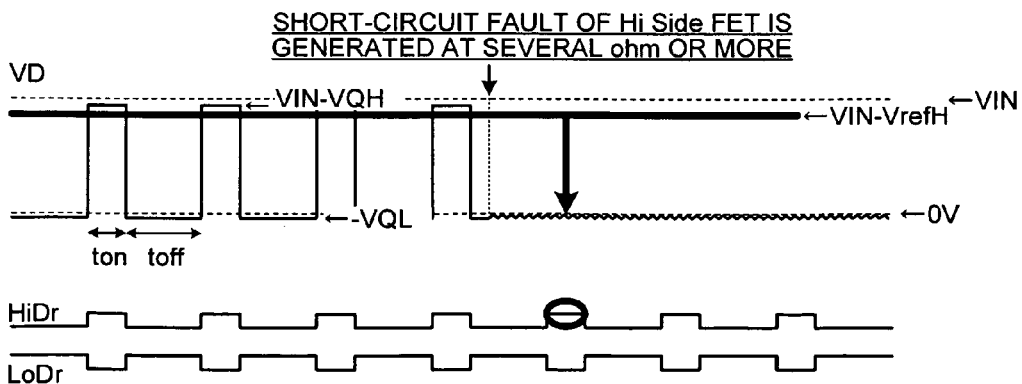
FIG. 11 is a diagram illustrating an operation waveform at the time of an open fault of the Hi Side FET that is generated when a load current is large.

Next, the open fault of the Hi Side FET that is generated when the load current is large will be described using FIG. 11. FIG. 11 illustrates an operation waveform at the time of an open fault of the Hi Side FET that is generated when the load current is large. In this case, the open fault means that the impedance ZQH of when the short-circuit fault is generated is more than several ohm. Therefore, the power supply control circuit according to the first embodiment can approximate the reference voltage VD to 0 V. Since "switching control signal (HiDr)=Hi and reference voltage (VD)<threshold value (VIN−VrefH)" are satisfied, the power supply control circuit determines that the short-circuit fault of the Hi Side FET is generated.

Specifically, if the comparison result of the reference voltage VD and the threshold value (VIN−VrefH) using the comparator (COMP 41) becomes VD<(VIN−VrefH), the power supply control circuit according to the first embodiment sets an output of the COMP 41 as Hi. Next, when the power supply control circuit receives the output Hi of the COMP 41 and the switching control signal HiDr=Hi by the AND circuit 42, the AND circuit 42 outputs Hi and the OR circuit 45 that receives the output of the AND circuit 42 outputs Hi. The output Hi of the OR circuit 45 is applied to the Set input of the FF circuit 46 and the output Q of the FF circuit 46 maintains the Hi state. This Hi state is continued until the FF circuit 46 is reset. Then, the power supply control circuit receives Q=Hi, performs logical inversion by the inverter 47, and turns off the Breaker FET 20 and the Breaker FET 30. As such, the power supply control circuit according to the first embodiment turns off the Breaker FET 20 and the Breaker FET 30 and separates the fault place for protection.

2-1-2. Case Where the Short-Circuit Fault of the Hi Side FET Is Generated (Load Current Is Small)

In this case, the short fault, the Low impedance fault, the High impedance fault, and the open fault that are generated in the Hi Side FET when the load current is small will be described. When the load current is small, this state is a state of load current (IOUT)<(½)×ripple current (ILpp).

a. Short Fault

Figure 12:
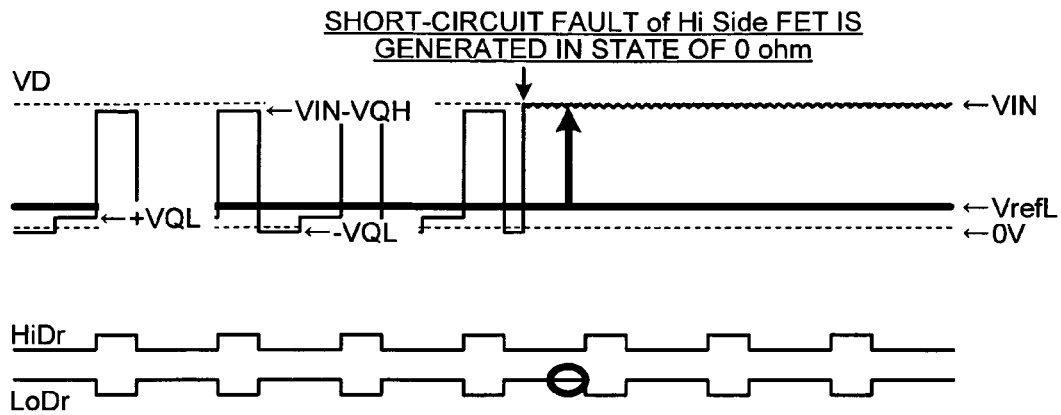
FIG. 12 is a diagram illustrating an operation waveform at the time of a short fault of the Hi Side FET that is generated when a load current is small.

First, the short fault of the Hi Side FET that is generated when the load current is small will be described using FIG. 12. FIG. 12 illustrates an operation waveform at the time of the short fault of the Hi Side FET that is generated when the load current is small. In this case, the short fault means that the impedance ZQH of when the short-circuit fault is generated is 0 ohm. Therefore, the power supply control circuit according to the first embodiment can approximate the reference voltage VD to VIN. Since switching control signal (LoDr)=Hi and reference voltage (VD)>threshold value (VrefL)" are satisfied, the power supply control circuit determines that the short-circuit fault of the Hi Side FET is generated.

Specifically, if the comparison result of the reference voltage VD and the threshold value VrefL using the comparator (COMP 43) becomes VD>VrefL, the power supply control circuit according to the first embodiment sets an output of the COMP 43 as Hi. Next, when the power supply control circuit receives the output Hi of the COMP 43 and the switching control signal LoDr=Hi by the AND circuit 44, the AND circuit 44 outputs Hi and the OR circuit 45 that receives the output of the AND circuit 44 outputs Hi. The output Hi of the OR circuit 45 is applied to the Set input of the FF circuit 46 and the output Q of the FF circuit 46 maintains the Hi state. This Hi state is continued until the FF circuit 46 is reset. Then, the power supply control circuit receives Q=Hi, performs logical inversion by the inverter 47, and turns off the Breaker FET 20 and the Breaker FET 30. As such, the power supply control circuit according to the first embodiment turns off the Breaker FET 20 and the Breaker FET 30 and separates the fault place for protection.

b. Low Impedance Fault

Figure 13:
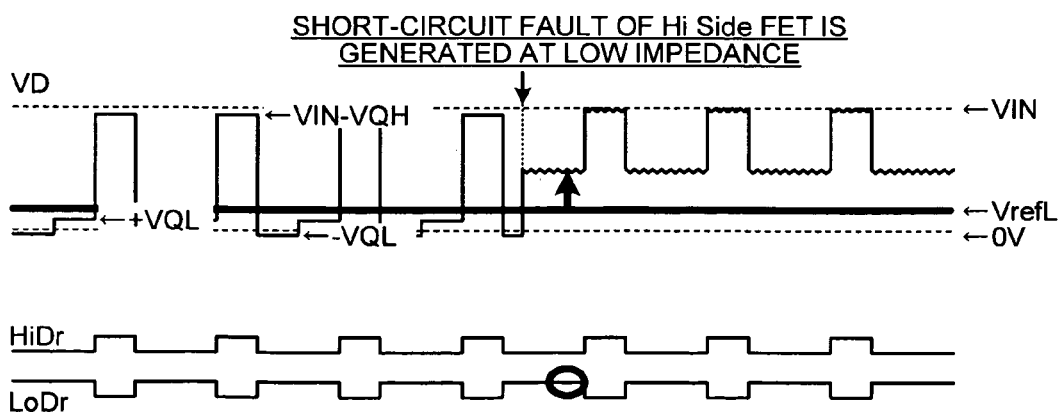
FIG. 13 is a diagram illustrating an operation waveform at the time of a Low impedance fault of the Hi Side FET that is generated when a load current is small.

Next, the Low impedance fault of the Hi Side FET that is generated when the load current is small will be described using FIG. 13. FIG. 13 illustrates an operation waveform at the time of a Low impedance fault of the Hi Side FET that is generated when the load current is small. In this case, the Low impedance fault means that the impedance ZQH of when the short-circuit fault is generated is a value (for example, several milli-ohm) approximated to the ON-resistance of the Hi Side FET. Therefore, the power supply control circuit according to the first embodiment can approximate the reference voltage VD to "(½)×VIN to VIN". Since "switching control signal (LoDr)=Hi and reference voltage (VD)>threshold value (VrefL)" are satisfied, the power supply control circuit determines that the short-circuit fault of the Hi Side FET is generated.

Specifically, if the comparison result of the reference voltage VD and the threshold value VrefL using the comparator (COMP 43) becomes VD>VrefL, the power supply control circuit according to the first embodiment sets an output of the COMP 43 as Hi. Next, when the power supply control circuit receives the output Hi of the COMP 43 and the switching control signal LoDr=Hi by the AND circuit 44, the AND circuit 44 outputs Hi and the OR circuit 45 that receives the output of the AND circuit 44 outputs Hi. The output Hi of the OR circuit 45 is applied to the Set input of the FF circuit 46 and the output Q of the FF circuit 46 maintains the Hi state. This Hi state is continued until the FF circuit 46 is reset. Then, the power supply control circuit receives Q=Hi, performs logical inversion by the inverter 47, and turns off the Breaker FET 20 and the Breaker FET 30. As such, the power supply control circuit according to the first embodiment turns off the Breaker FET 20 and the Breaker FET 30 and separates the fault place for protection.

c. High Impedance Fault

Figure 14:
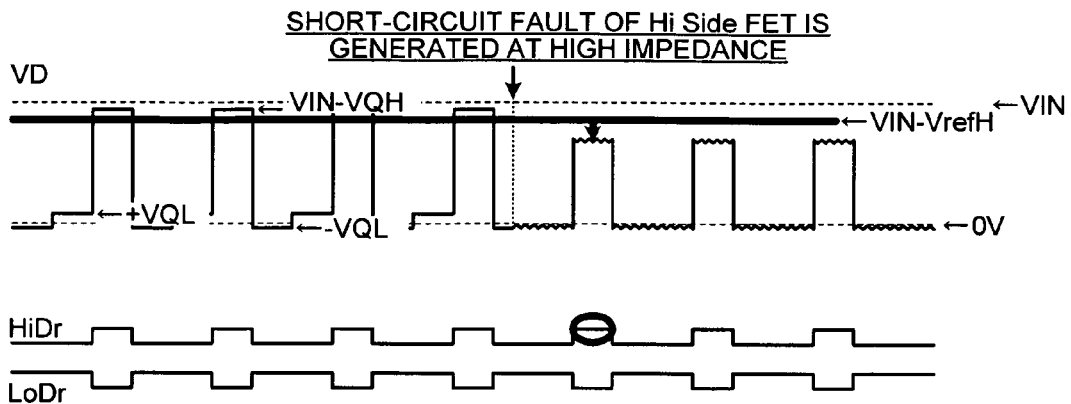
FIG. 14 is a diagram illustrating an operation waveform at the time of a High impedance fault of the Hi Side FET that is generated when a load current is small.

Next, the High impedance fault of the Hi Side FET that is generated when the load current is small will be described using FIG. 14. FIG. 14 illustrates an operation waveform at the time of a High impedance fault of the Hi Side FET that is generated when the load current is small. In this case, the High impedance fault means that the impedance ZQH of when the short-circuit fault is generated is a value (for example, several tens of milli-ohm) more than the ON-resistance of the Hi Side FET. Therefore, the power supply control circuit according to the first embodiment can approximate the reference voltage VD to "0 V to (VIN−(Ids×ZQH))" by decreasing the voltage by Ids×ZQH. Since "switching control signal (HiDr)=Hi and reference voltage (VD)<threshold value (VIN−VrefH)" are satisfied, the power supply control circuit determines that the short-circuit fault of the Hi Side FET is generated.

Specifically, if the comparison result of the reference voltage VD and the threshold value (VIN−VrefH) using the comparator (COMP 41) becomes VD<(VIN−VrefH), the power supply control circuit according to the first embodiment sets an output of the COMP 41 as Hi. Next, if the power supply control circuit receives the output Hi of the COMP 41 and the switching control signal HiDr=Hi by the AND circuit 42, the AND circuit 42 outputs Hi and the OR circuit 45 that receives the output of the AND circuit 42 outputs Hi. The output Hi of the OR circuit 45 is applied to the Set input of the FF circuit 46 and the output Q of the FF circuit 46 maintains the Hi state. This Hi state is continued until the FF circuit 46 is reset. Then, the power supply control circuit receives Q=Hi, performs logic inversion by the inverter 47, and turns off the Breaker FET 20 and the Breaker FET 30. As such, the power supply control circuit according to the first embodiment turns off the Breaker FET 20 and the Breaker FET 30 and separates the fault place for protection.

d. Open Fault

Figure 15:
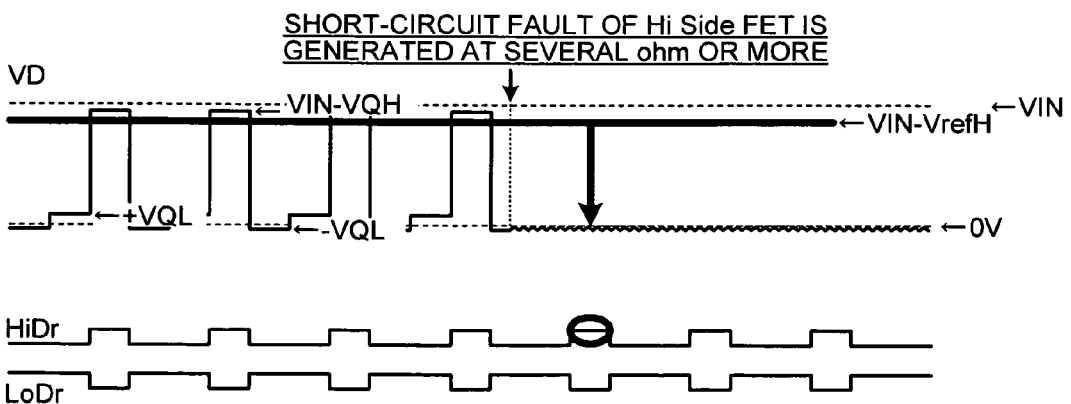
FIG. 15 is

Next, the open fault of the Hi Side FET that is generated when the load current is small will be described using FIG. 15. FIG. 15 illustrates an operation waveform at the time of an open fault of the Hi Side FET that is generated when the load current is small. In this case, the open fault means that the impedance ZQH of when the short-circuit fault is generated is more than several ohm. Therefore, the power supply control circuit according to the first embodiment can approximate the reference voltage VD to 0 V. Since "switching control signal (HiDr)=Hi and reference voltage (VD)<threshold value (VIN−VrefH)" are satisfied, the power supply control circuit determines that the short-circuit fault of the Hi Side FET is generated.

Specifically, if the comparison result of the reference voltage VD and the threshold value (VIN−VrefH) using the comparator (COMP 41) becomes VD<(VIN−VrefH), the power supply control circuit according to the first embodiment sets an output of the COMP 41 as Hi. Next, when the power supply control circuit receives the output Hi of the COMP 41 and the switching control signal HiDr=Hi by the AND circuit 42, the AND circuit 42 outputs Hi and the OR circuit 45 that receives the output of the AND circuit 42 outputs Hi. The output Hi of the OR circuit 45 is applied to the Set input of the FF circuit 46 and the output Q of the FF circuit 46 maintains the Hi state. This Hi state is continued until the FF circuit 46 is reset. Then, the power supply control circuit receives Q=Hi, performs logical inversion by the inverter 47, and turns off the Breaker FET 20 and the Breaker FET 30. As such, the power supply control circuit according to the first embodiment turns off the Breaker FET 20 and the Breaker FET 30 and separates the fault place for protection.

2-2. Case Where the Short-Circuit Fault of the Lo Side FET Is Generated

Figure 16:
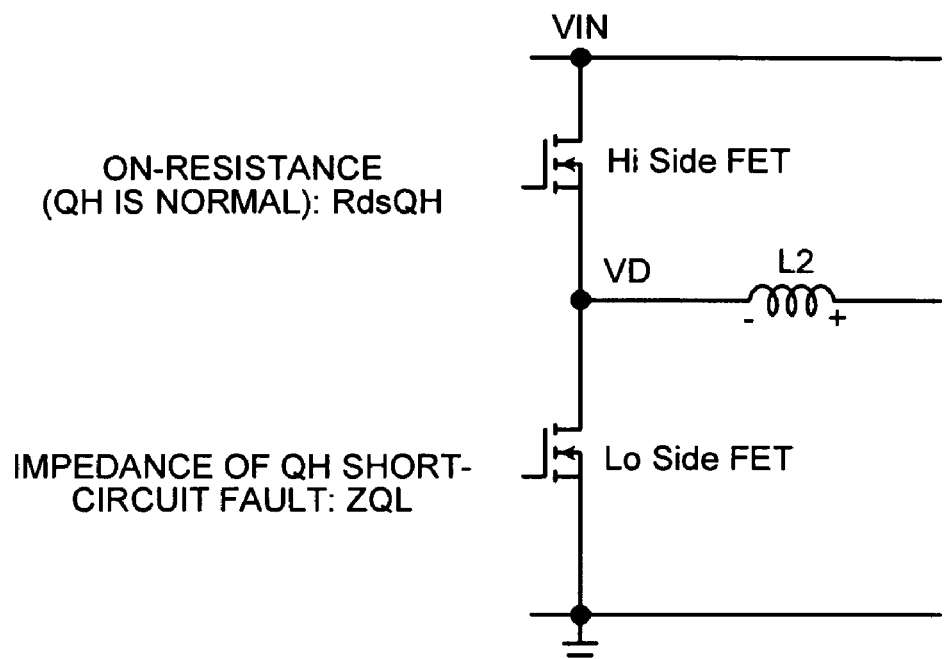
FIG. 16 is a diagram illustrating the case where a short-circuit fault of a Lo side FET is generated.

Next, the outline of the case of the generation of the short-circuit fault of the Lo Side FET 16 will be described using FIG. 16. FIG. 16 illustrates the case where the short-circuit fault of the Lo Side FET is generated. As illustrated in FIG. 16, in the case where the short-circuit fault of the Lo Side FET is generated, if the impedance of the short-circuit fault of the Lo Side FET is defined as ZQL, VIN division of the ON-resistance RdsQH and ZQL of the Hi Side FET and ZQH becomes the reference voltage VD. That is, "VD=(ZQL)/(RdsQH+ZQL)×VIN" is satisfied.

2-2-1. Case Where the Short-Circuit Fault of the Lo Side FET Is Generated (Load Current Is Large)

In this case, the short fault, the Low impedance fault, the High impedance fault, and the open fault that are generated in the Lo Side FET when the load current is large will be described. When the load current is large, this state is a state of load current (IOUT)>=(½)×ripple current (ILpp).

a. Short Fault

Figure 17:
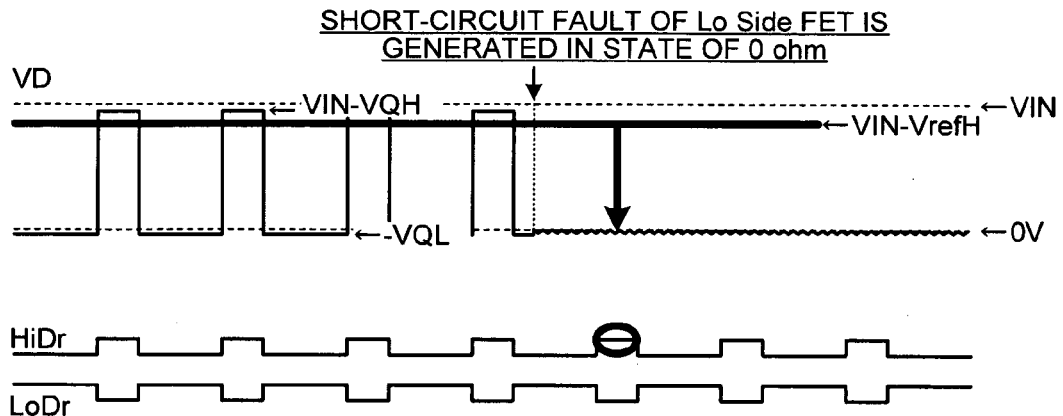
FIG. 17 is a diagram illustrating an operation waveform at the time of a short fault of the Lo Side FET that is generated when a load current is large.

First, the short fault of the Lo Side FET that is generated when the load current is large will be described using FIG. 17. FIG. 17 illustrates an operation waveform at the time of the short fault of the Lo Side FET that is generated when the load current is large. In this case, the short fault means that the impedance ZQH of when the short-circuit fault is generated is 0 ohm. Therefore, the power supply control circuit according to the first embodiment can approximate the reference voltage VD to 0 V. Since "switching control signal (HiDr)=Hi and reference voltage (VD)<threshold value (VIN−VrefH)" are satisfied, the power supply control circuit determines that the short-circuit fault of the Lo Side FET is generated.

Specifically, if the comparison result of the reference voltage VD and the threshold value VIN−VrefH using the comparator (COMP 41) becomes VD<VIN−VrefH, the power supply control circuit according to the first embodiment sets an output of the COMP 41 as Hi. Next, when the power supply control circuit receives the output Hi of the COMP 41 and the switching control signal HiDr=Hi by the AND circuit 42, the AND circuit 42 outputs Hi and the OR circuit 45 that receives the output of the AND circuit 42 outputs Hi. The output Hi of the OR circuit 45 is applied to the Set input of the FF circuit 46 and the output Q of the FF circuit 46 maintains the Hi state. This Hi state is continued until the FF circuit 46 is reset. Then, the power supply control circuit receives Q=Hi, performs logical inversion by the inverter 47, and turns off the Breaker FET 20 and the Breaker FET 30. As such, the power supply control circuit according to the first embodiment turns off the Breaker FET 20 and the Breaker FET 30 and separates the fault place for protection.

b. Low Impedance Fault

Figure 18:
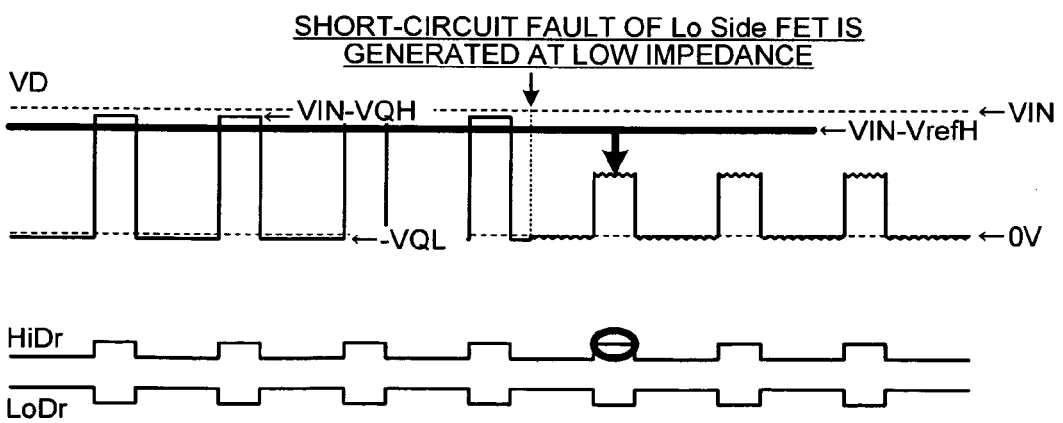
FIG. 18 is a diagram illustrating an operation waveform at the time of a Low impedance fault of the Lo Side FET that is generated when a load current is large.

Next, the Low impedance fault of the Lo Side FET that is generated when the load current is large will be described using FIG. 18. FIG. 18 illustrates an operation waveform at the time of a Low impedance fault of the Lo Side FET that is generated when the load current is large. In this case, the Low impedance fault means that the impedance ZQH of when the short-circuit fault is generated is a value (for example, several milli-ohm) approximated to the ON-resistance of the Lo Side FET. Therefore, the power supply control circuit according to the first embodiment can approximate the reference voltage VD to "0 V to ((½)×VIN)". Since "switching control signal (HiDr)=Hi and reference voltage (VD)<threshold value (VIN−VrefH)" are satisfied, the power supply control circuit determines that the short-circuit fault of the Lo Side FET is generated.

Specifically, if the comparison result of the reference voltage VD and the threshold value VIN−VrefH using the comparator (COMP 41) becomes VD<VIN−VrefH, the power supply control circuit according to the first embodiment sets an output of the COMP 41 as Hi. Next, when the power supply control circuit receives the output Hi of the COMP 41 and the switching control signal HiDr=Hi by the AND circuit 42, the AND circuit 42 outputs Hi and the OR circuit 45 that receives the output of the AND circuit 42 outputs Hi. The output Hi of the OR circuit 45 is applied to the Set input of the FF circuit 46 and the output Q of the FF circuit 46 maintains the Hi state. This Hi state is continued until the FF circuit 46 is reset. Then, the power supply control circuit receives Q=Hi, performs logical inversion by the inverter 47, and turns off the Breaker FET 20 and the Breaker FET 30. As such, the power supply control circuit according to the first embodiment turns off the Breaker FET 20 and the Breaker FET 30 and separates the fault place for protection.

c. High Impedance Fault

Figure 19:
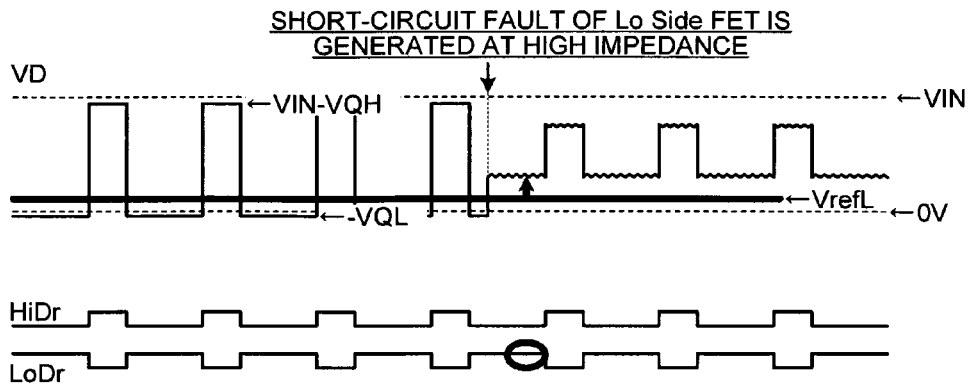
FIG. 19 is a diagram illustrating an operation waveform at the time of a High impedance fault of the Lo Side FET that is generated when a load current is large.

Next, the High impedance fault of the Lo Side FET that is generated when the load current is large will be described using FIG. 19. FIG. 19 illustrates an operation waveform at the time of a High impedance fault of the Lo Side FET that is generated when the load current is large. In this case, the High impedance fault means that the impedance ZQH of when the short-circuit fault is generated is a value (for example, several tens of milli-ohm) more than the ON-resistance of the Lo Side FET. Therefore, the power supply control circuit according to the first embodiment can approximate the reference voltage VD to "(Ids×ZQH)) to 0 V". Since "switching control signal (LoDr)=Hi and reference voltage (VD)>threshold value (VrefL)" are satisfied, the power supply control circuit determines that the short-circuit fault of the Lo Side FET is generated.

Specifically, if the comparison result of the reference voltage VD and the threshold value (VrefL) using the comparator (COMP 43) becomes VD>VrefL, the power supply control circuit according to the first embodiment sets an output of the COMP 43 as Hi. Next, if the power supply control circuit receives the output Hi of the COMP 43 and the switching control signal LoDr=Hi by the AND circuit 44, the AND circuit 44 outputs Hi and the OR circuit 45 that receives the output of the AND circuit 44 outputs Hi. The output Hi of the OR circuit 45 is applied to the Set input of the FF circuit 46 and the output Q of the FF circuit 46 maintains the Hi state. This Hi state is continued until the FF circuit 46 is reset. Then, the power supply control circuit receives Q=Hi, performs logic inversion by the inverter 47, and turns off the Breaker FET 20 and the Breaker FET 30. As such, the power supply control circuit according to the first embodiment turns off the Breaker FET 20 and the Breaker FET 30 and separates the fault place for protection.

d. Open Fault

Figure 20:
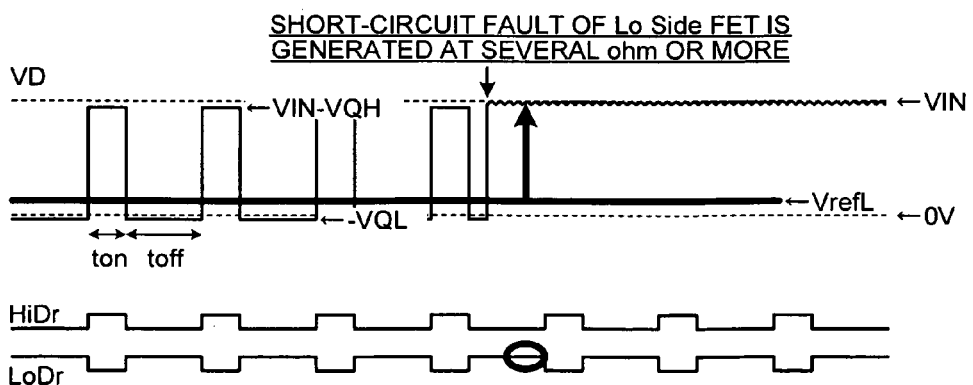
FIG. 20 is a diagram illustrating an operation waveform at the time of an open fault of the Lo Side FET that is generated when a load current is large.

Next, the open fault of the Lo Side FET that is generated when the load current is large will be described using FIG. 20. FIG. 20 illustrates an operation waveform at the time of an open fault of the Lo Side FET that is generated when the load current is large. In this case, the open fault means that the impedance ZQH of when the short-circuit fault is generated is more than several ohm. Therefore, the power supply control circuit according to the first embodiment can approximate the reference voltage VD to VIN. Since "switching control signal (LoDr)=Hi and reference voltage (VD)>threshold value (VrefL)" are satisfied, the power supply control circuit determines that the short-circuit fault of the Lo Side FET is generated.

Specifically, if the comparison result of the reference voltage VD and the threshold value VrefL using the comparator (COMP 43) becomes VD>VrefL, the power supply control circuit according to the first embodiment sets an output of the COMP 43 as Hi. Next, when the power supply control circuit receives the output Hi of the COMP 43 and the switching control signal LoDr=Hi by the AND circuit 44, the AND circuit 44 outputs Hi and the OR circuit 45 that receives the output of the AND circuit 44 outputs Hi. The output Hi of the OR circuit 45 is applied to the Set input of the FF circuit 46 and the output Q of the FF circuit 46 maintains the Hi state. This Hi state is continued until the FF circuit 46 is reset. Then, the power supply control circuit receives Q=Hi, performs logical inversion by the inverter 47, and turns off the Breaker FET 20 and the Breaker FET 30. As such, the power supply control circuit according to the first embodiment turns off the Breaker FET 20 and the Breaker FET 30 and separates the fault place for protection.

2-1-2. Case Where the Short-Circuit Fault of the Lo Side FET Is Generated (Load Current Is Small)

In this case, the short fault, the Low impedance fault, the High impedance fault, and the open fault that are generated in the Lo Side FET 16 when the load current is small will be described. When the load current is small, this state is a state of "load current (IOUT)<(½)×ripple current (ILpp)".

a. Short Fault

Figure 21:
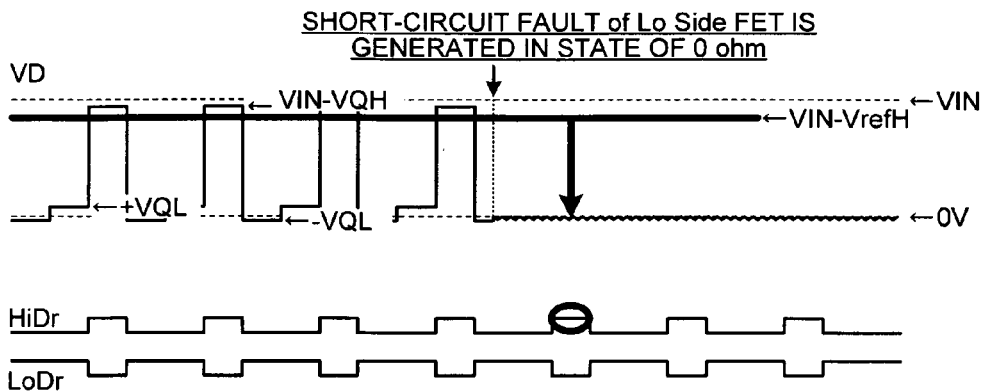
FIG. 21 is a diagram illustrating an operation waveform at the time of a short fault of the Lo Side FET that is generated when a load current is small.

First, the short fault of the Lo Side FET that is generated when the load current is small will be described using FIG. 21. FIG. 21 illustrates an operation waveform at the time of the short fault of the Lo Side FET that is generated when the load current is small. In this case, the short fault means that the impedance ZQH of when the short-circuit fault is generated is 0 ohm. Therefore, the power supply control circuit according to the first embodiment can approximate the reference voltage VD to 0 V. Since "switching control signal (HiDr)=Hi and reference voltage (VD)<threshold value (VIN−VrefH)" are satisfied, the power supply control circuit determines that the short-circuit fault of the Lo Side FET is generated.

Specifically, if the comparison result of the reference voltage VD and the threshold value VIN−VrefH using the comparator (COMP 41) becomes VD<VIN−VrefH, the power supply control circuit according to the first embodiment sets an output of the COMP 41 as Hi. Next, when the power supply control circuit receives the output Hi of the COMP 41 and the switching control signal HiDr=Hi by the AND circuit 42, the AND circuit 42 outputs Hi and the OR circuit 45 that receives the output of the AND circuit 42 outputs Hi. The output Hi of the OR circuit 45 is applied to the Set input of the FF circuit 46 and the output Q of the FF circuit 46 maintains the Hi state. This Hi state is continued until the FF circuit 46 is reset. Then, the power supply control circuit receives Q=Hi, performs logical inversion by the inverter 47, and turns off the Breaker FET 20 and the Breaker FET 30. As such, the power supply control circuit according to the first embodiment turns off the Breaker FET 20 and the Breaker FET 30 and separates the fault place for protection.

b. Low Impedance Fault

Figure 22:
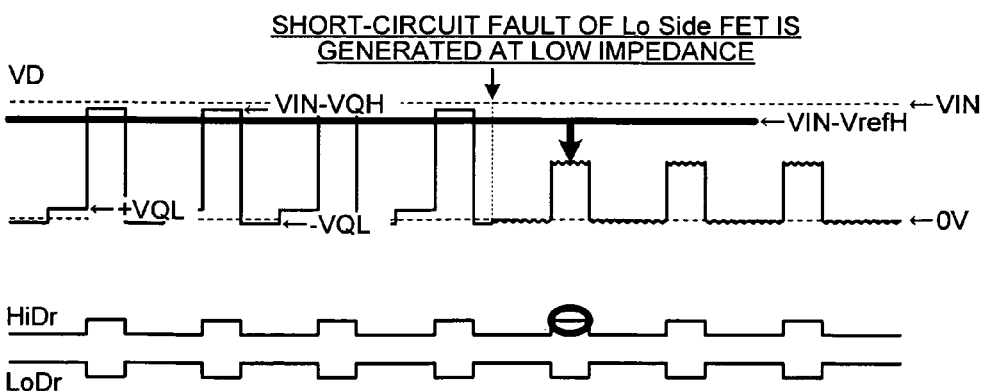
FIG. 22 is a diagram illustrating an operation waveform at the time of a Low impedance fault of the Lo Side FET that is generated when a load current is small.

Next, the Low impedance fault of the Lo Side FET that is generated when the load current is small will be described using FIG. 22. FIG. 22 illustrates an operation waveform at the time of a Low impedance fault of the Lo Side FET that is generated when the load current is small. In this case, the Low impedance fault means that the impedance ZQH of when the short-circuit fault is generated is a value (for example, several milli-ohm) approximated to the ON-resistance of the Lo Side FET. Therefore, the power supply control circuit according to the first embodiment can approximate the reference voltage VD to "0 V to ×(½)×VIN". Since "switching control signal (VIN−VrefH)=Hi and reference voltage (VD)<threshold value (VrefL)" are satisfied, the power supply control circuit determines that the short-circuit fault of the Lo Side FET is generated.

Specifically, if the comparison result of the reference voltage VD and the threshold value VIN−VrefH using the comparator (COMP 41) becomes VD<VIN−VrefH, the power supply control circuit according to the first embodiment sets an output of the COMP 41 as Hi. Next, when the power supply control circuit receives the output Hi of the COMP 41 and the switching control signal HiDr=Hi by the AND circuit 42, the AND circuit 42 outputs Hi and the OR circuit 45 that receives the output of the AND circuit 42 outputs Hi. The output Hi of the OR circuit 45 is applied to the Set input of the FF circuit 46 and the output Q of the FF circuit 46 maintains the Hi state. This Hi state is continued until the FF circuit 46 is reset. Then, the power supply control circuit receives Q=Hi, performs logical inversion by the inverter 47, and turns off the Breaker FET 20 and the Breaker FET 30. As such, the power supply control circuit according to the first embodiment turns off the Breaker FET 20 and the Breaker FET 30 and separates the fault place for protection.

c. High Impedance Fault

Figure 23:
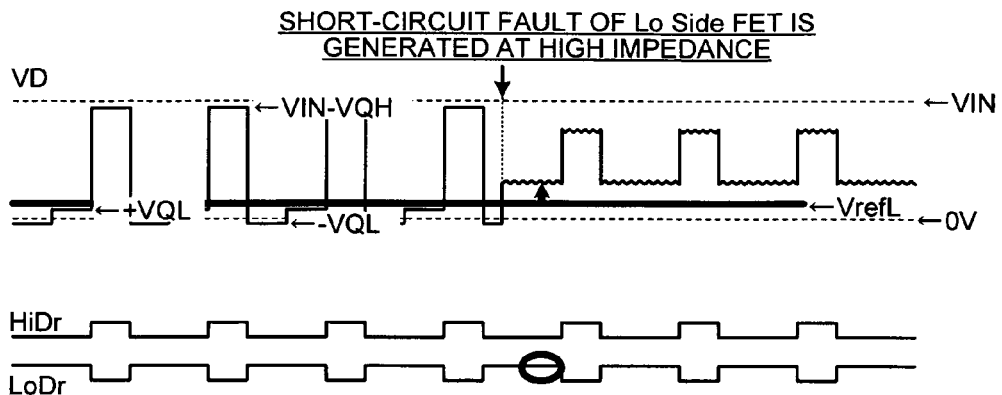
FIG. 23 is a diagram illustrating an operation waveform at the time of a High impedance fault of the Lo Side FET that is generated when a load current is small.

Next, the High impedance fault of the Lo Side FET that is generated when the load current is small will be described using FIG. 23. FIG. 23 illustrates an operation waveform at the time of a High impedance fault of the Lo Side FET that is generated when the load current is small. In this case, the High impedance fault means that the impedance ZQH of when the short-circuit fault is generated is a value (for example, several tens of milli-ohm) more than the ON-resistance of the Lo Side FET. Therefore, the power supply control circuit according to the first embodiment can approximate the reference voltage VD to "(Ids×ZQH) to 0 V)." Since "switching control signal (LoDr)=Hi and reference voltage (VD) >threshold value (VrefL)" are satisfied, the power supply control circuit determines that the short-circuit fault of the Lo Side FET is generated.

Specifically, if the comparison result of the reference voltage VD and the threshold value (VrefL) using the comparator (COMP 43) becomes VD>VrefL, the power supply control circuit according to the first embodiment sets an output of the COMP 43 as Hi. Next, if the power supply control circuit receives the output Hi of the COMP 43 and the switching control signal LoDr=Hi by the AND circuit 44, the AND circuit 44 outputs Hi and the OR circuit 45 that receives the output of the AND circuit 44 outputs Hi. The output Hi of the OR circuit 45 is applied to the Set input of the FF circuit 46 and the output Q of the FF circuit 46 maintains the Hi state. This Hi state is continued until the FF circuit 46 is reset. Then, the power supply control circuit receives Q=Hi, performs logic inversion by the inverter 47, and turns off the Breaker FET 20 and the Breaker FET 30. As such, the power supply control circuit according to the first embodiment turns off the Breaker FET 20 and the Breaker FET 30 and separates the fault place for protection.

d. Open Fault

Figure 24:
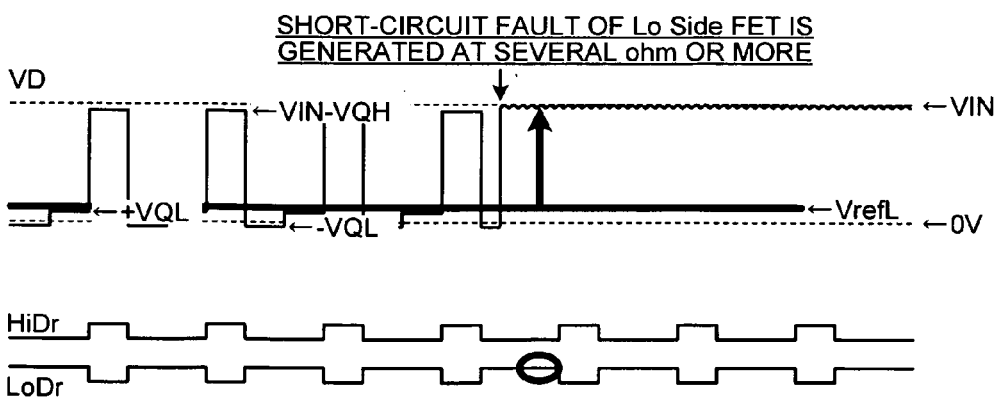
FIG. 24 is a diagram illustrating an operation waveform at the time of an open fault of the Lo Side FET that is generated when a load current is small.

Next, the open fault of the Lo Side FET that is generated when the load current is small will be described using FIG. 24. FIG. 24 illustrates an operation waveform at the time of an open fault of the Lo Side FET that is generated when the load current is small. In this case, the open fault means that the impedance ZQH of when the short-circuit fault is generated is more than several ohm. Therefore, the power supply control circuit according to the first embodiment can approximate the reference voltage VD to VIN. Since "switching control signal (LoDr)=Hi and reference voltage (VD)>threshold value (VrefL)" are satisfied, the power supply control circuit determines that the short-circuit fault of the Lo Side FET is generated.

Specifically, if the comparison result of the reference voltage VD and the threshold value VrefL using the comparator (COMP 43) becomes VD>VrefL, the power supply control circuit according to the first embodiment sets an output of the COMP 43 as Hi. Next, when the power supply control circuit receives the output Hi of the COMP 43 and the switching control signal LoDr=Hi by the AND circuit 44, the AND circuit 44 outputs Hi and the OR circuit 45 that receives the output of the AND circuit 44 outputs Hi. The output Hi of the OR circuit 45 is applied to the Set input of the FF circuit 46 and the output Q of the FF circuit 46 maintains the Hi state. This Hi state is continued until the FF circuit 46 is reset. Then, the power supply control circuit receives Q=Hi, performs logic inversion by the inverter 47, and turns off the Breaker FET 20 and the Breaker FET 30. As such, the power supply control circuit according to the first embodiment turns off the Breaker FET 20 and the Breaker FET 30 and separates the fault place for protection.

Effect According to First Embodiment

As such, according to the first embodiment, the short-circuit fault can be accurately detected. For example, the reference voltage (VD) between the Hi Side FET 15 and the Lo Side FET 16 is detected, and the current is not used when the fault is determined. Therefore, even in the case where the excessive current at the time of the normal power supply or the reverse current at the time of the rapid load change is generated, the FET short-circuit fault can be prevented from being erroneously detected. The acquired reference voltage (VD) is not the minute voltage and can be directly input to the comparator COMP 41 or COMP 43. As a result, without using the amplifier (AMP) or the delay circuit (DELAY), the short-circuit fault can be immediately determined, and the Breaker FET 20 and the Breaker FET 30 can be opened. Therefore, the response time can be shortened and the short-circuit fault can be suppressed from spreading.

Instead of the method that detects the current and determines the fault, the method that detects the reference voltage (VD) and determines the fault is used. Therefore, even when the impedance fault is generated, the impedance fault can be detected by the AND logic with the switching control signal. Specifically, by detecting the reference voltage (VD) between the Hi Side FET 15 and the Lo Side FET 16 and taking the AND logic with the switching control signal, when the logic is not matched with the originally expected logic, the generation of the fault is detected. Therefore, at the time of generation of the impedance fault where VD becomes a halfway voltage different from the original voltage, the logical abnormality can be identified. Therefore, the generation of the impedance fault can be detected and the heat generation and the burnout can be prevented.

The reference voltage (VD) between the Hi Side FET 15 and the Lo Side FET 16 is detected and the fault is determined. Therefore, the current sense resistor (Rsense) becomes unnecessary, and the increase in the power loss that is generated when the current sense resistor (Rsense) is used can be prevented. Since the current does not need to be detected in determining the fault, the current sense resistor (Rsense), the amplifier (AMP), and the DELAY (filter of the peak) become unnecessary. Therefore, the number of all components of the protection circuit (power supply control circuit) decreases, and the mounting area and the cost can be decreased.

[b] Second Embodiment

The first embodiment is described. However, the present invention may be implemented by various embodiments different from the first embodiment. Therefore, the configuration is divided into (1) the parallel configuration and (2) the circuit configuration and the different embodiments are described below.

(1) Parallel Configuration

Figure 25:
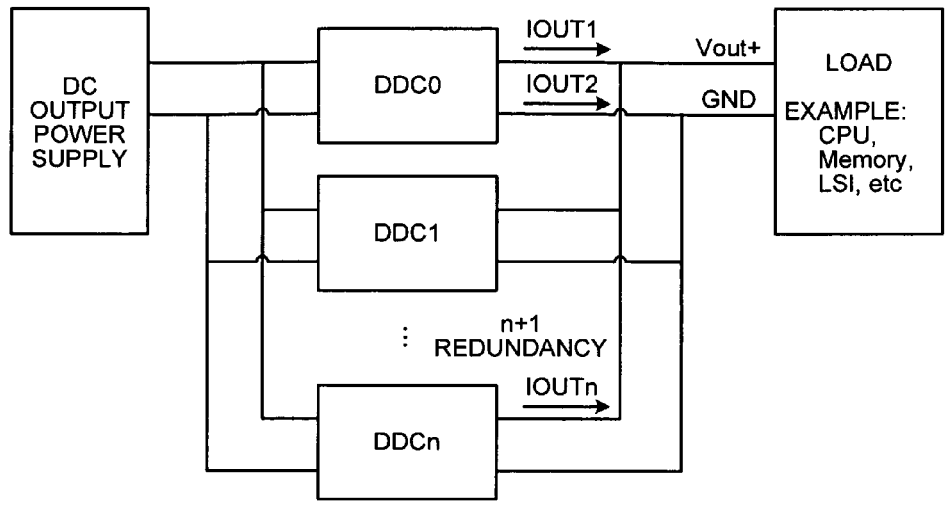
FIG. 25 is a diagram illustrating an example of the case where (n+1) DDCs to which the power supply control circuit according to the present invention is applied are connected in parallel.
Figure 26:
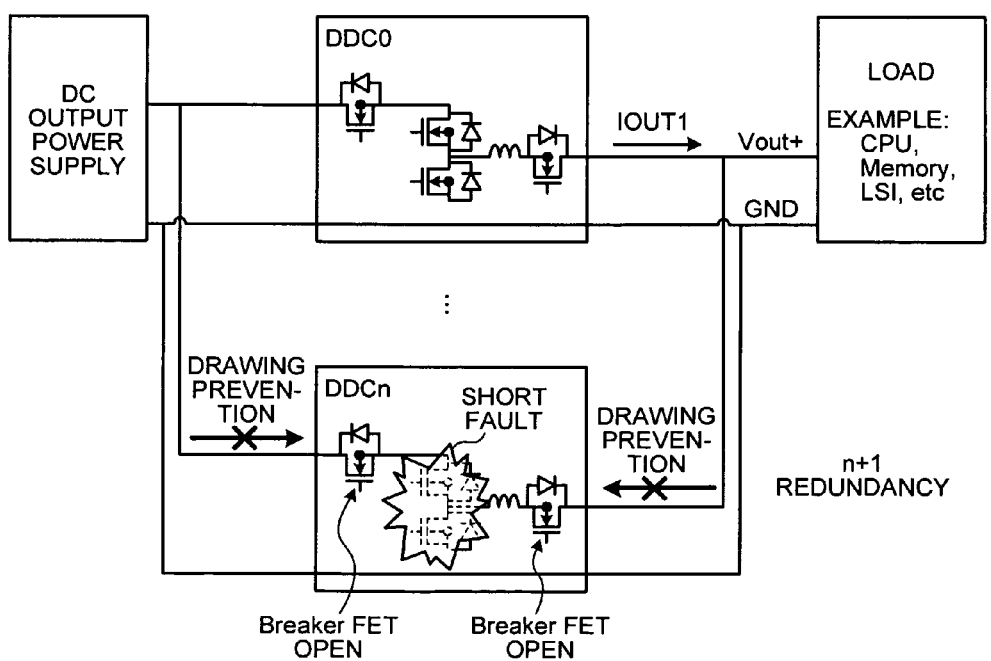
FIG. 26 is a diagram illustrating an example of the case where a fault is generated in the configuration in which (n+1) DDCs to which the power supply control circuit according to the present invention is applied are connected in parallel.

For example, in the first embodiment, one DDC where the power supply control circuit according to the present invention is applied is exemplified. However, as illustrated in FIG. 25, (n+1) DDCs (DDC0 to DDCn) where the power supply control circuit according to the present invention is applied can be connected in parallel. In general, in the case where the general power supply control circuits are connected in parallel, if one power supply control circuit is failed, the input voltage and the output voltage are drawn to the failed DDC and are lowered. As a result, the power supply stop or the load stop of the entire device is generated. Therefore, in the configuration in which the (n+1) DDCs (DDC0 to DDCn) where the power supply control circuit according to the present invention is applied are connected in parallel, even when one DDC is failed, as illustrated in FIG. 26, the fault place can be separated by opening the Breaker FET. Therefore, the fault of one DDC can be prevented from spreading to the other DDCs.

FIG. 25 illustrates an example of the case where (n+1) DDCs to which the power supply control circuit according to the present invention is applied are connected in parallel. FIG. 26 illustrates an example of the case where a fault is generated in the configuration in which (n+1) DDCs to which the power supply control circuit according to the present invention is applied are connected in parallel.

(2) Circuit Configuration

The components of the individual apparatus that are illustrated in the drawings are functional and conceptual, and do not need to be physically configured as illustrated in the drawings. That is, the specific forms of separation and/or integration of the apparatuses are not limited to the forms illustrated in the drawings. All or part of the components may be configured to be functionally or physically separated and/or integrated in an arbitrary unit according to the various loads or use situations. For example, in the configuration of FIG. 2, when the short-circuit fault is generated in the Hi Side FET 15 or the Lo Side FET 16, the fault place is separated by opening both the Breaker FET 20 and the Breaker FET 30. However, the fault place may be separated by opening the Breaker FET 20 or the Breaker FET 30.

According to an embodiment of the power supply control device according to the present invention, the short-circuit fault can be accurately detected.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A power supply control circuit, comprising:
a first current breaking circuit of which an input terminal is connected to a first electrode of an input power supply and which breaks a current from the input power supply based on a break control signal inputted to a control terminal;
a first switching circuit of which an input terminal is connected to an output terminal of the first current breaking circuit, of which an output terminal is connected to a reference node, and that switches a current flown to the reference node or a current flown from the reference node based on a first switching control signal inputted to a control terminal;
a second switching circuit of which an input terminal is connected to the reference node, of which an output terminal is connected to a second electrode of the input power supply, and that switches a current flown from the reference node or a current flown to the reference node based on a second switching control signal inputted to a control terminal;
a second current breaking circuit of which an output terminal is connected to a load and which breaks a current from the input power supply based on the break control signal inputted to a control terminal; and
a break control signal generating circuit that outputs the break control signal when the first switching control signal is in an ON state in the case where a voltage of the reference node is lower than a first reference voltage as the comparison result of the voltage of the reference node and the first reference voltage, or when the second switching control signal is in an ON state in the case where the voltage of the reference node is higher than a second reference voltage as the comparison result of the voltage of the reference node and the second reference voltage.

2. The power supply control circuit according to claim 1, wherein
the break control signal generating circuit includes
a first comparing circuit that compares the voltage of the reference node and the first reference voltage,
a first logical product circuit that generates the logical product of an output of the first comparing circuit and the first switching control signal,
a second comparing circuit that compares the voltage of the reference node and the second reference voltage,
a second logical product circuit that generates the logical product of an output of the second comparing circuit and the second switching control signal, and
a logical sum generating circuit that generates the logical sum of an output of the first logical product circuit and an output of the second logical product circuit.

3. The power supply control circuit according to claim 2, wherein the break control signal generating circuit further includes a holding circuit that holds an output of the logical sum generating circuit and outputs the break control signal.

4. The power supply control circuit according to claim 1, wherein the first reference voltage is higher than the second reference voltage.

5. The power supply control circuit according to claim 1, wherein the first switching control signal and the second switching control signal become ON exclusively.

6. The power supply control circuit according to claim 1, further comprising a first smoothing circuit that is connected in parallel to an output terminal of the first current breaking circuit and the second electrode of the input power supply.

7. The power supply control circuit according to claim 1, wherein the power supply control circuit smoothes a current flown from the reference node to the input terminal of the second current breaking circuit or a current flown from the input terminal of the second current breaking circuit to the reference node through a second smoothing circuit.

8. A power supply device, comprising:
an input power supply;
a first current breaking circuit of which an input terminal is connected to a first electrode of the input power supply and that breaks a current from the input power supply based on a break control signal inputted to a control terminal;
a first switching circuit of which an input terminal is connected to an output terminal of the first current breaking circuit, of which an output terminal is connected to a reference node, and that switches a current flown to the reference node or a current flown from the reference node based on a first switching control signal inputted to a control terminal;
a second switching circuit of which an input terminal is connected to the reference node, of which an output terminal is connected to a second electrode of the input power supply, and that switches a current flown from the reference node or a current flown to the reference node based on a second switching control signal inputted to a control terminal;
a second current breaking circuit of which an output terminal is connected to a load and that breaks a current from the input power supply based on the break control signal inputted to a control terminal; and
a break control signal generating circuit that outputs the break control signal when the first switching control signal is in an ON state in the case where a voltage of the reference node is lower than a first reference voltage as the comparison result of the voltage of the reference node and the first reference voltage, or when the second switching control signal is in an ON state in the case where the voltage of the reference node is higher than a second reference voltage as the comparison result of the voltage of the reference node and the second reference voltage.

9. A method of controlling a power supply control device, comprising:
breaking a current from the input power supply based on a break control signal inputted to a control terminal;
switching a current flown to a reference node or a current flown from the reference node based on a first switching control signal inputted to a control terminal;
switching a current flown from the reference node or a current flown to the reference node based on a second switching control signal inputted to the control terminal;
breaking a current from the reference node on the basis of the break control signal inputted to a control terminal; and
outputting the break control signal when the first switching control signal is in an ON state in the case where a voltage of the reference node is lower than a first reference voltage as the comparison result of the voltage of the reference node and the first reference voltage, or when the second switching control signal is in an ON state in the case where the voltage of the reference node is higher than a second reference voltage as the comparison result of the voltage of the reference node and the second reference voltage.

10. The method according to claim 9, wherein the first reference voltage is higher than the second reference voltage.

11. The method according to claim 9, wherein the first switching control signal and the second switching control signal become ON exclusively.

* * * * *